(12) United States Patent
Choi et al.

(10) Patent No.: US 8,044,451 B2
(45) Date of Patent: Oct. 25, 2011

(54) METHOD OF MANUFACTURING SEMICONDUCTOR DEVICE HAVING NOTCHED GATE MOSFET

(75) Inventors: Byung-yong Choi, Suwon-si (KR); Choong-ho Lee, Seognam-si (KR); Dong-won Kim, Seongnam-si (KR); Dong-gun Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 12/498,615

(22) Filed: Jul. 7, 2009

(65) Prior Publication Data

US 2009/0267137 A1    Oct. 29, 2009

Related U.S. Application Data

(63) Continuation of application No. 11/329,943, filed on Jan. 11, 2006, now abandoned.

(30) Foreign Application Priority Data

Jan. 12, 2005  (KR) .................. 10-2005-0002877
Feb. 24, 2005 (KR) .................. 10-2005-0015372

(51) Int. Cl.
*H01L 29/788* (2006.01)

(52) U.S. Cl. .. 257/316; 438/267; 438/257; 257/E21.683

(58) Field of Classification Search ............. 257/316, 257/324; 438/267, 257, 265, 266
See application file for complete search history.

(56) References Cited

U.S. PATENT DOCUMENTS 5,290,720 A    3/1994   Chen
(Continued)

FOREIGN PATENT DOCUMENTS

| JP | 2003-51558 | | 2/2003 |
|---|---|---|---|
| KR | 2003-0051038 | A | 12/2001 |
| KR | 2003-0013624 | A | 2/2003 |
| KR | 10-2004-0082018 | A | 9/2004 |
| WO | 02099893 | A1 | 12/2002 |

OTHER PUBLICATIONS

"Method of Manufacturing Semiconductor Device Having Notched Gate MOSFET" Specification, Drawings, and Prosecution History of U.S. Appl. No. 11/329,943, filed Jan. 11, 2006, by Byung-yong Choi, et al., which is stored in the United States Patent and Trademark Office (USPTO) Image File Wrapper (IFW) system.

(Continued)

*Primary Examiner* — Walter L Lindsay, Jr.
*Assistant Examiner* — Reema Patel
(74) *Attorney, Agent, or Firm* — Onello & Mello, LLP

(57) ABSTRACT

Provided is a method of manufacturing a semiconductor device, by which a cell transistor formed on a cell array area of a semiconductor substrate employs a structure in which an electrode in the shape of spacers is used to form a gate and a multi-bit operation is possible using localized bits, and transistors having structures optimized to satisfy different requirements depending upon functions of the transistors can be formed on a peripheral circuit area which is the residual area of the semiconductor substrate. In this method, a cell transistor is formed on the cell array area. The cell transistor includes a notch gate structure, a first channel region formed on a semiconductor substrate under the notch gate structure, a source region and a drain region formed on both sides of the first channel region, a first gate insulation film formed between the first channel region and the notch gate structure, and a memory layer locally formed on areas adjacent to the source and drain regions between the first channel region and the notch gate structure. At the same time that the cell transistor is formed, a plurality of peripheral circuit transistors including at least one transistor having a different structure from the cell transistor are formed on the peripheral circuit area.

20 Claims, 24 Drawing Sheets

U.S. PATENT DOCUMENTS

| | | | |
|---|---|---|---|
| 5,358,879 | A | 10/1994 | Brady et al. |
| 5,600,168 | A | 2/1997 | Lee |
| 6,680,230 | B2 | 1/2004 | Arai et al. |
| 6,737,322 | B2 | 5/2004 | Inoue et al. |
| 6,784,483 | B2 | 8/2004 | Chen |
| 6,806,517 | B2 | 10/2004 | Kim et al. |
| 6,818,507 | B2 * | 11/2004 | Ueda .............................. 438/257 |
| 6,911,691 | B2 | 6/2005 | Tomiie et al. |
| 6,967,143 | B2 | 11/2005 | Mathew et al. |
| 7,217,624 | B2 | 5/2007 | Lim et al. |
| 7,419,879 | B2 | 9/2008 | Choi et al. |
| 2004/0026733 | A1 | 2/2004 | Tomiie et al. |
| 2004/0135212 | A1 | 7/2004 | Dokumaci et al. |
| 2004/0183106 | A1 | 9/2004 | Kim et al. |
| 2006/0154410 | A1 | 7/2006 | Choi et al. |
| 2006/0154421 | A1 | 7/2006 | Choi et al. |
| 2008/0283879 | A1 | 11/2008 | Choi et al. |

OTHER PUBLICATIONS

"Transistor Having Gate Dielectric Layer of Partial Thickness Difference and Method of Fabricating the Same" Specification, Drawings, and Prosecution History of U.S. Appl. No. 11/329,623, filed Jan. 11, 2006, by Byung-yong Choi, et al., which is stored in the United States Patent and Trademark Office (USPTO) Image File Wrapper (IFW) system.

"Transistor Having Gate Dielectric Layer of Partial Thickness Difference and Method of Fabricating the Same" Specification, Drawings, and Prosecution History of U.S. Appl. No. 12/182,593, filed Jul. 30, 2008, by Byung-yong Choi, et al., which is stored in the United States Patent and Trademark Office (USPTO) Image File Wrapper (IFW) system.

* cited by examiner

METHOD OF MANUFACTURING SEMICONDUCTOR DEVICE HAVING NOTCHED GATE MOSFET

CROSS-REFERENCE TO RELATED PATENT APPLICATIONS

This application is a continuation of U.S. patent application Ser. No. 11/329,943, filed on Jan. 11, 2006, which claims the benefit of Korean Patent Application Numbers 10-2005-0002877, filed on Jan. 12, 2005, and 10-2005-0015372, filed on Feb. 24, 2005, in the Korean Intellectual Property Office, the contents of which are incorporated herein in their entirety by reference.

BACKGROUND OF THE INVENTION

1. Field of the Invention

The present invention relates to a method of manufacturing a semiconductor device, and more particularly, to a method of manufacturing a semiconductor device, by which process integration of a transistor capable of a multi-bit operation on a cell array area and a metal oxide semiconductor field effect transistor (MOSFET) on a peripheral circuit area is facilitated simultaneously.

2. Description of the Related Art

Silicon-oxide-nitride-oxide-silicon (SONOS) or metal-oxide-nitride-oxide-silicon (MONOS) devices have been proposed as non-volatile memory devices that are widely used in mobile communications systems, memory cards, etc. Most of such SONOS semiconductor memory devices employ a stacked SONOS transistor structure in which an ONO structure exists over the entire channel area of a transistor. In this stacked SONOS transistor structure, since an ONO structure exists over the entire channel area of a transistor, the cell transistor has a high initial threshold voltage Vth and a high program current. Hence, integrating the stacked SONOS transistor together with a logic product having a low initial threshold voltage Vth into a single chip is difficult due to the high initial threshold voltage Vth. Also, in a stacked SONOS-type cell transistor, electrons trapped in a storage node layer within an ONO structure may move horizontally along the storage node layer, and thus an erasing operation may not be properly performed. Furthermore, as an FET is scaled to a high level with rapid development of the semiconductor industry, various problems, such as an increase in leakage current due to a reduction of the size of a semiconductor device, occur.

To operate a general flash memory device, there is a need to form a cell transistor array on a cell array area and also form a low voltage (LV) or high voltage (HV) MOSFET circuit block, including such circuits as a program/erase (P/E) controller, a data load latch, a word line decoder, an address buffer, and a sense amp, on a peripheral circuit area and a core area (hereinafter, both referred to as a peripheral circuit area). To integrate a cell transistor array having a storage node and circuit blocks of a peripheral circuit area into a single chip as in a SONOS structure, efficient process integration between a cell array area and the peripheral circuit is required. In particular, when a cell transistor having a structure capable of a multi-bit operation using localized bits is formed, a process of forming a cell transistor array on a cell array area and a process of forming an HV transistor and a LV transistor on a peripheral circuit area are simultaneously performed. In this case, a process of readily forming transistors having structures designed differently according to unique functions of the transistors to maintain the unique functions and electrical characteristics of the transistors is needed.

SUMMARY OF THE INVENTION

The present invention provides a method of manufacturing a semiconductor device, by which problems caused upon formation of a transistor having a reduced size required by a scaling technique for obtaining a super-highly integrated device can be solved, and a process of forming a cell transistor capable of a multi-bit operation and a process of forming a perimeter circuit transistor can be easily integrated with each other.

According to an aspect of the present invention, there is provided a method of manufacturing a semiconductor device. According to the method, a semiconductor substrate including a cell array area and a peripheral circuit area is provided. A cell transistor is formed on the cell array area of the semiconductor substrate, the cell transistor including a notch gate structure, a first channel region formed on the semiconductor substrate under the notch gate structure, a source region and a drain region formed on both sides of the first channel region, a first gate insulation film formed between the first channel region and the notch gate structure, and a memory layer locally formed on areas adjacent to the source and drain regions between the first channel region and the notch gate structure. A plurality of peripheral circuit transistors including at least one transistor having a different structure from the cell transistor on the peripheral circuit area is formed at the same time when the cell transistor is formed.

The peripheral circuit transistors may include a high voltage transistor and a low voltage transistor.

The formation of the plurality of peripheral circuit transistors may include forming a high voltage transistor having the same structure as the cell transistor on the peripheral circuit area at the same time when the cell transistor is formed and forming a low voltage transistor on the peripheral circuit area at the same time when the cell transistor is formed, the low voltage transistor having a second gate insulation film of a thickness smaller than a thickness of the first gate insulation film of the cell transistor and a second channel region of a length smaller than a length of the first channel region. The method of the invention can further include forming a stack of a first insulation film, the memory layer, and a second insulation film on each of the cell array area and the peripheral circuit area of the semiconductor substrate. The first gate insulation film is formed on the cell array area and on an area of the peripheral circuit area on which the high voltage transistor is to be formed. The second gate insulation film is formed on an area of the peripheral circuit area on which the low voltage transistor is to be formed. Gates of the cell transistor, the high voltage transistor, and the low voltage transistor each having the notch gate structure are simultaneously formed on the cell array area and the peripheral circuit area. A portion of the stack is removed so that the remaining portion of the stack remains only between the semiconductor substrate and each of the gates of the cell transistor, the high voltage transistor, and the low voltage transistor. Extension areas that define the length of the second channel region are formed by implanting ions into an area of the semiconductor substrate under the gate of the low voltage transistor. Extension areas that define the length of the first channel region are formed by implanting ions into areas of the semiconductor substrate under the gate of the cell transistor and under the high voltage transistor. The source and drain regions are simultaneously formed on the cell array area and the peripheral circuit area.

In one embodiment, forming the gates of the cell transistor, the high voltage transistor, and the low voltage transistor comprises: forming first conductive layers on the first and second insulation films; and forming third conductive layers in the shape of spacers on portions of a third insulation film that contact both sidewalls of the first conductive layers. A distance between the semiconductor substrate and the second conductive layers is greater than a distance between the semiconductor substrate and the first conductive layers.

In one embodiment, forming the plurality of peripheral circuit transistors comprises forming a high voltage transistor and a low voltage transistor having structures different from the structure of the cell transistor in the peripheral circuit area simultaneously with the formation of the cell transistor. In this case, a low voltage transistor is formed on the peripheral circuit area simultaneously with the formation of the cell transistor, the low voltage transistor having a second gate insulation film of a thickness smaller than a thickness of the first gate insulation film of the cell transistor and a second channel region of a length smaller than a length of the first channel region.

In one embodiment, the method comprises forming a stack of a first insulation film, the memory layer, and a second insulation film on each of the cell array area and the peripheral circuit area of the semiconductor substrate. The first gate insulation film is formed on the cell array area and on an area of the peripheral circuit area on which the high voltage transistor is to be formed. The second gate insulation film is formed on an area of the peripheral circuit area on which the low voltage transistor is to be formed. Gates of the cell transistor, the high voltage transistor, and the low voltage transistor each having the notch gate structure are simultaneously formed on the cell array area and the peripheral circuit area. A portion of the stack is removed so that the remaining portion of the stack remains only between the semiconductor substrate and each of the gates of the cell transistor, the high voltage transistor, and the low voltage transistor. Only the memory layer is removed from a portion of the stack remaining under the gates of the high voltage transistor and the low voltage transistor on the peripheral circuit area. Extension areas that define the length of the second channel region are formed by implanting ions into an area of the semiconductor substrate under the gate of the low voltage transistor. Extension areas that define the length of the first channel region are formed by implanting ions into areas of the semiconductor substrate under the gates of the cell transistor and the high voltage transistor. The source and drain regions are simultaneously formed on the cell array area and the peripheral circuit area.

In one embodiment, forming the gates of the cell transistor, the high voltage transistor, and the low voltage transistor comprises: forming first conductive layers on the first and second insulation films; and forming third conductive layers in the shape of spacers on portions of a third insulation film that contact both sidewalls of the first conductive layers. A distance between the semiconductor substrate and the second conductive layers is greater than a distance between the semiconductor substrate and the first conductive layers.

In one embodiment, the method further comprises, after removing only the memory layer of the portion of the stack on the peripheral circuit area, filling the empty spaces resulting from the removal of the memory layer with insulation liners.

In one embodiment, the method comprises forming a stack of a first insulation film, the memory layer, and a second insulation film on each of the cell array area and the peripheral circuit area of the semiconductor substrate. The first gate insulation film is formed on the cell array area and on an area of the peripheral circuit area on which the high voltage transistor is to be formed. The second gate insulation film is formed on an area of the peripheral circuit area on which the low voltage transistor is to be formed. A gate of the cell transistor is formed on the cell array area, the gate including a first conductive layer formed on the first gate insulation film and second conductive layers formed on portions of a third insulation film that contact both sidewalls of the first conductive layer. A gate of the high voltage transistor is formed on the peripheral circuit area, the gate including a third conductive layer formed on the first gate insulation film and fourth conductive layers in the shape of spacers formed on both sidewalls of the third conductive layer. A gate of the low voltage transistor is formed on the peripheral circuit area, the gate including a fifth conductive layer formed on the first gate insulation film and sixth conductive layers in the shape of spacers formed on both sidewalls of the fifth conductive layer. A portion of the stack is removed so that the memory layer remains only between the semiconductor substrate and the second conductive layer on the cell array area. Extension areas that define the length of the second channel region are formed by implanting ions into an area of the semiconductor substrate under the gate of the low voltage transistor. Extension areas that define the length of the first channel region are formed by implanting ions into areas of the semiconductor substrate under the gates of the cell transistor and the high voltage transistor. The source and drain regions are simultaneously formed on the cell array area and the peripheral circuit area.

In one embodiment, the gates of the cell transistor, the high voltage transistor, and the low voltage transistor are formed simultaneously.

In one embodiment, a distance between the semiconductor substrate and the second conductive layers is greater than a distance between the semiconductor substrate and the first conductive layers; a distance between the semiconductor substrate and the fourth conductive layers is greater than a distance between the semiconductor substrate and the third conductive layers; and a distance between the semiconductor substrate and the sixth conductive layers is greater than a distance between the semiconductor substrate and the fifth conductive layers.

In one embodiment, the method further comprises: removing only the memory layer of the stack on the peripheral circuit area to form an empty space in the stack; and filling the empty space in the stack with insulation liners.

In one embodiment, the fourth conductive layer in the gate of the high voltage transistor directly contacts both sidewalls of the third conductive layer.

In one embodiment, a fourth insulation film is interposed between the fourth conductive layer and both sides of the third conductive layer in the gate of the high voltage transistor.

In one embodiment, the sixth conductive layer in the gate of the low voltage transistor directly contacts both sidewalls of the fifth conductive layer.

In one embodiment, a fourth insulation film is interposed between the sixth conductive layer and both sides of the fifth conductive layer in the gate of the low voltage transistor.

In one embodiment, the method comprises forming a stack of a first insulation film, the memory layer, and a second insulation film on only the cell array area. The first gate insulation film is formed on the cell array area and on an area of the peripheral circuit area on which the high voltage transistor is to be formed. The second gate insulation film is formed on an area of the peripheral circuit area on which the low voltage transistor is to be formed. A gate of the cell transistor is formed on the cell array area, the gate including a first conductive layer formed on the first gate insulation film and second conductive layers formed on portions of a third insulation film that contact both sidewalls of the first conductive layer. A gate of the high voltage transistor is formed on the peripheral circuit area, the gate including a third conductive layer formed on the first gate insulation film and fourth conductive layers in the shape of spacers formed on both sidewalls of the third conductive layer. A gate of the low voltage transistor is formed on the peripheral circuit area, the gate including a fifth conductive layer formed on the second gate insulation film and sixth conductive layers in the shape of spacers formed on both sidewalls of the fifth conductive layer. A portion of the stack is removed so that the memory layer remains only between the semiconductor substrate and the second conductive layer on the cell array area. Extension areas that define the length of the second channel region are formed by implanting ions into an area of the semiconductor substrate under the gate of the low voltage transistor. Extension areas that define the length of the first channel region are formed by implanting ions into areas of the semiconductor substrate under the gates of the cell transistor and the high voltage transistor. The source and drain regions are simultaneously formed on the cell array area and the peripheral circuit area.

In one embodiment, the gates of the cell transistor, the high voltage transistor, and the low voltage transistor are formed simultaneously.

In one embodiment, a distance between the semiconductor substrate and the second conductive layers is greater than a distance between the semiconductor substrate and the first conductive layers; a distance between the semiconductor substrate and the fourth conductive layers is greater than a distance between the semiconductor substrate and the third conductive layers; and a distance between the semiconductor substrate and the sixth conductive layers is greater than a distance between the semiconductor substrate and the fifth conductive layers.

In one embodiment, the method further comprises: removing only the memory layer of the stack on the peripheral circuit area to form an empty space in the stack; and filling the empty space in the stack with insulation liners.

In one embodiment, the fourth conductive layer in the gate of the high voltage transistor directly contacts both sidewalls of the third conductive layer.

In one embodiment, a fourth insulation film is interposed between the fourth conductive layer and both sides of the third conductive layer in the gate of the high voltage transistor.

In one embodiment, the sixth conductive layer in the gate of the low voltage transistor directly contacts both sidewalls of the fifth conductive layer.

In one embodiment, a fourth insulation film is interposed between the sixth conductive layer and both sides of the fifth conductive layer in the gate of the low voltage transistor.

According to the present invention, a process of integrating a memory cell of a non-volatile memory device into a peripheral circuit is simplified, and a transistor for a peripheral circuit area manufactured simultaneously with a cell transistor may have a notch gate structure to thus reduce leakage current in a gate. Additionally, an overlap capacitance between a source/drain and the gate is reduced, and the performance of the memory device is improved.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully with reference to the accompanying drawings, in which exemplary embodiments of the invention are shown. It should be noted that, throughout the description, unless noted otherwise, when a layer is described as being formed on another layer or on a substrate, the layer may be formed directly on the other layer or on the substrate, or one or more layers may be interposed between the layer and the other layer or the substrate.

This application incorporates by reference the entire contents of another U.S. patent application, filed on even date herewith, assigned to Samsung Electronics Co., Ltd., entitled, "Transistor Having Gate Dielectric Layer of Partial Thickness Difference and Method of Fabricating the Same," naming as inventors Byung-yong Choi, Chang-woo Oh, Dong-gun Park and Dong-won Kim.

Figure 1A:
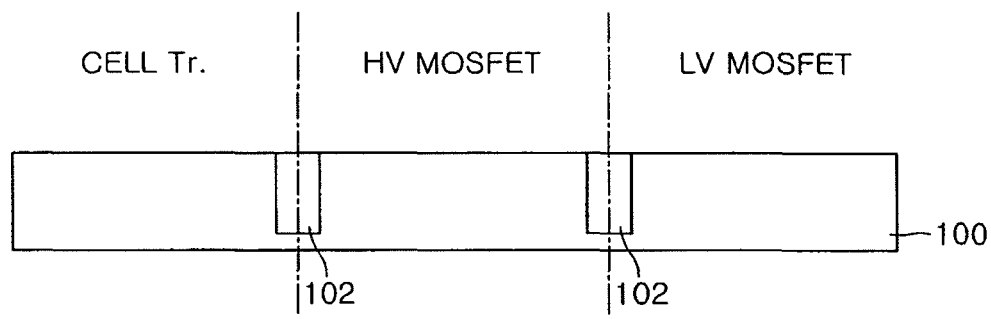
FIGS. 1A through 1O are cross-sectional views illustrating a method of manufacturing a semiconductor device according to an embodiment of the present invention.
Figure 1B:
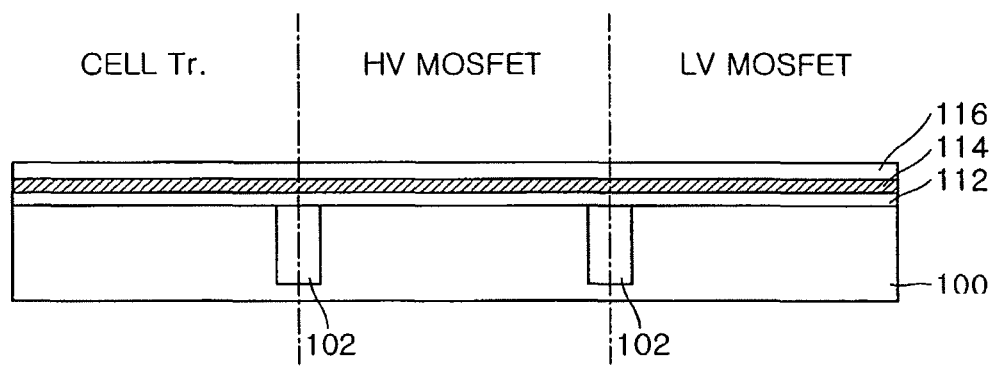
Figure 1C:
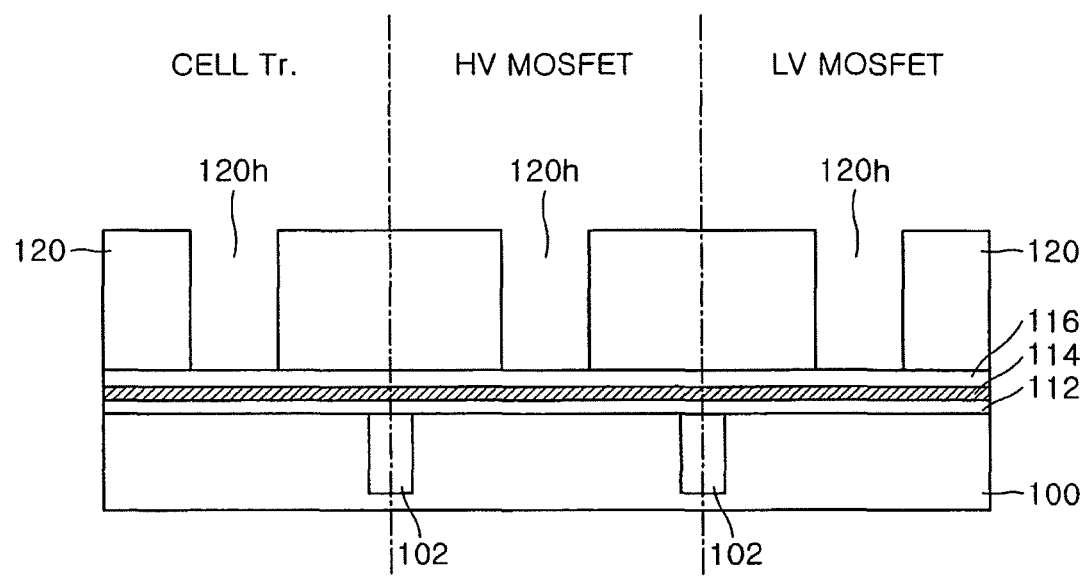
Figure 1D:
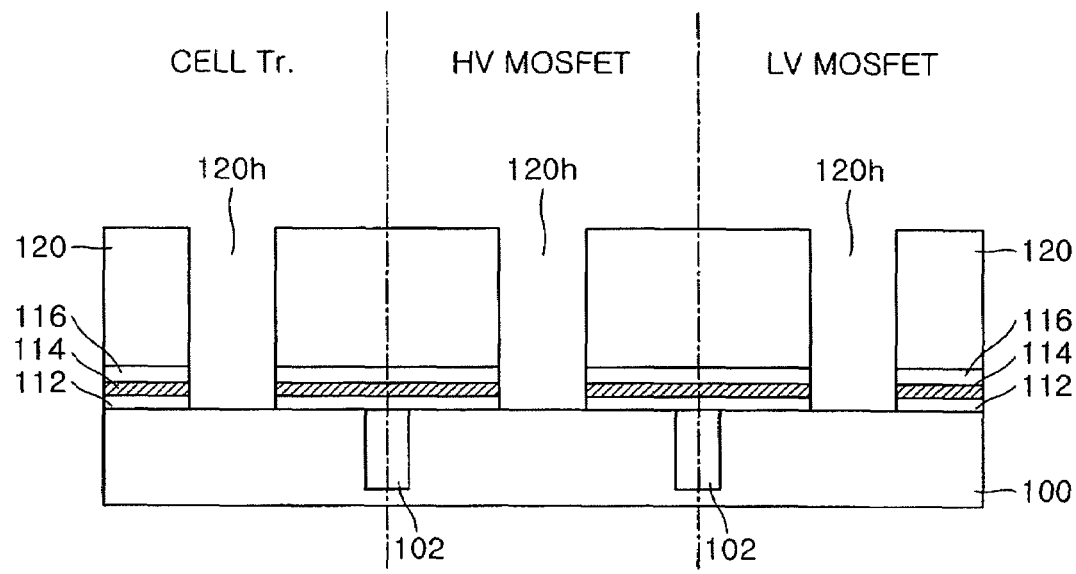
Figure 1E:
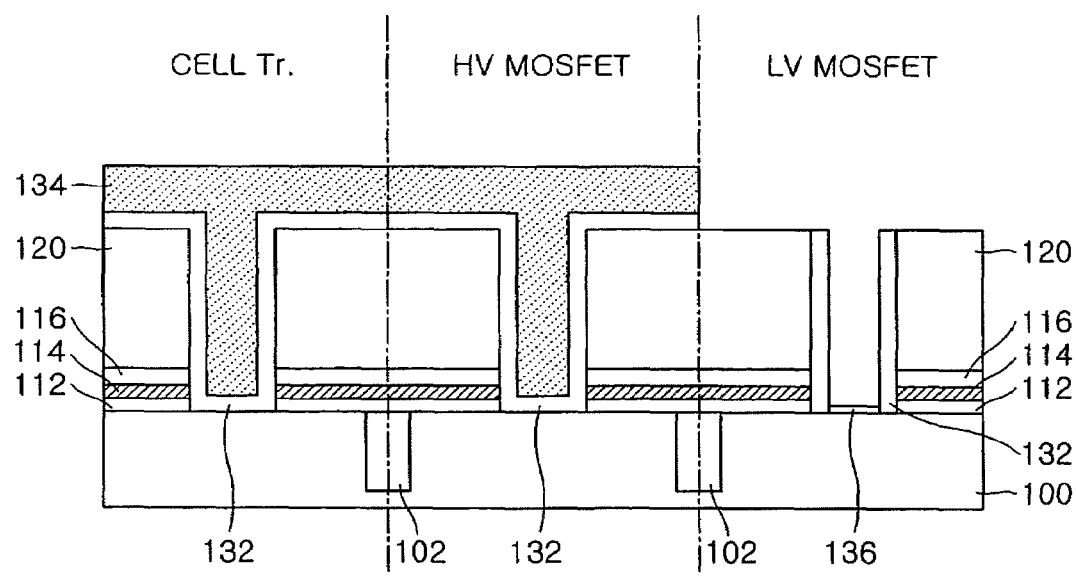
Figure 1F:
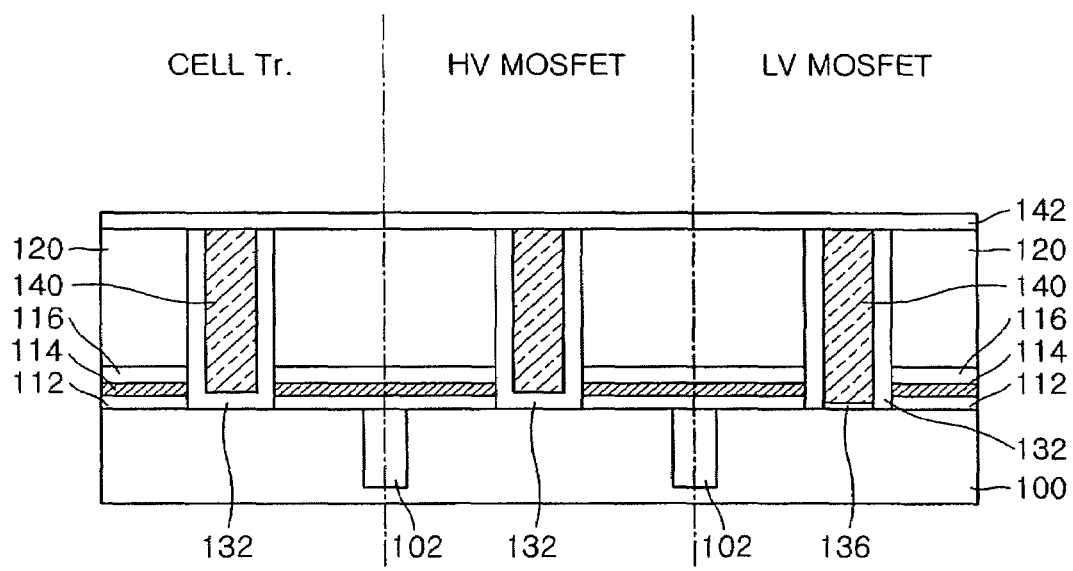
Figure 1G:
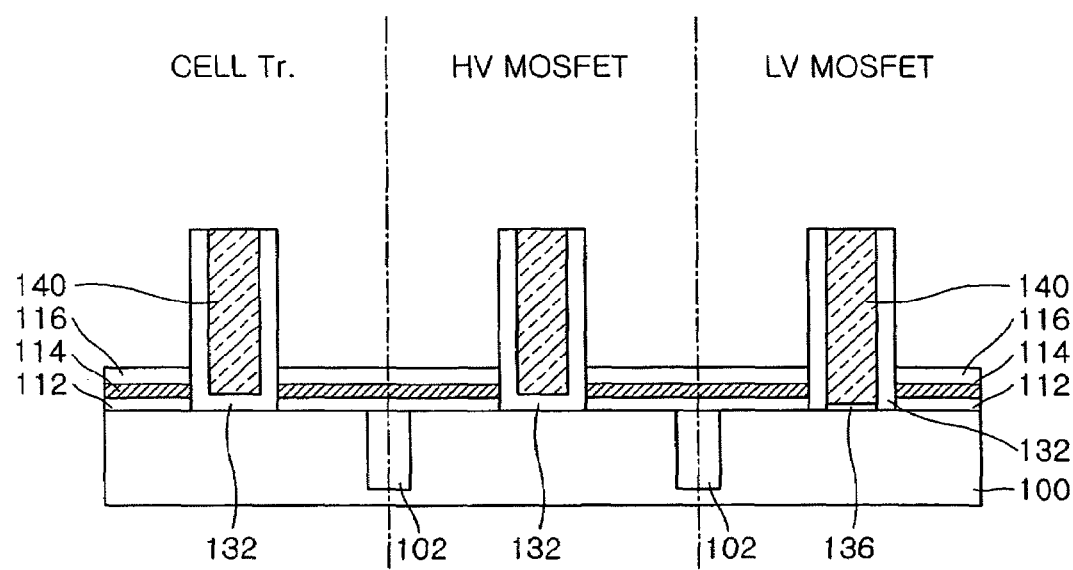
Figure 1H:
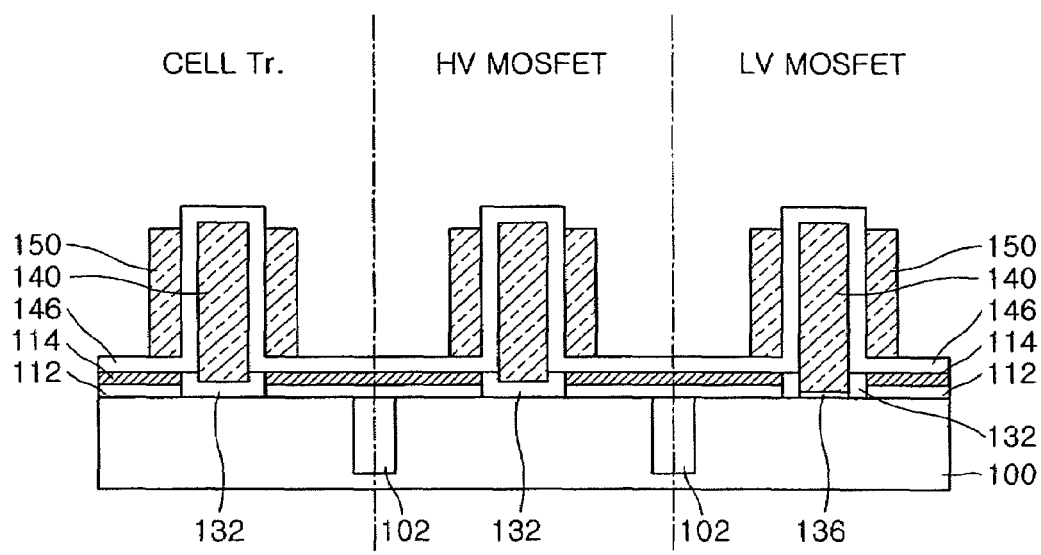
Figure 1I:
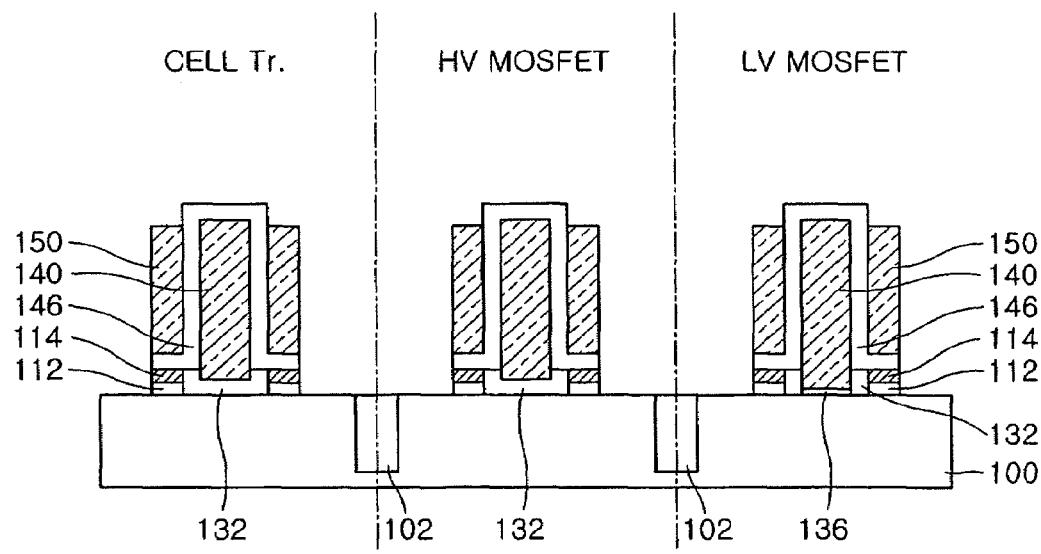
Figure 1J:
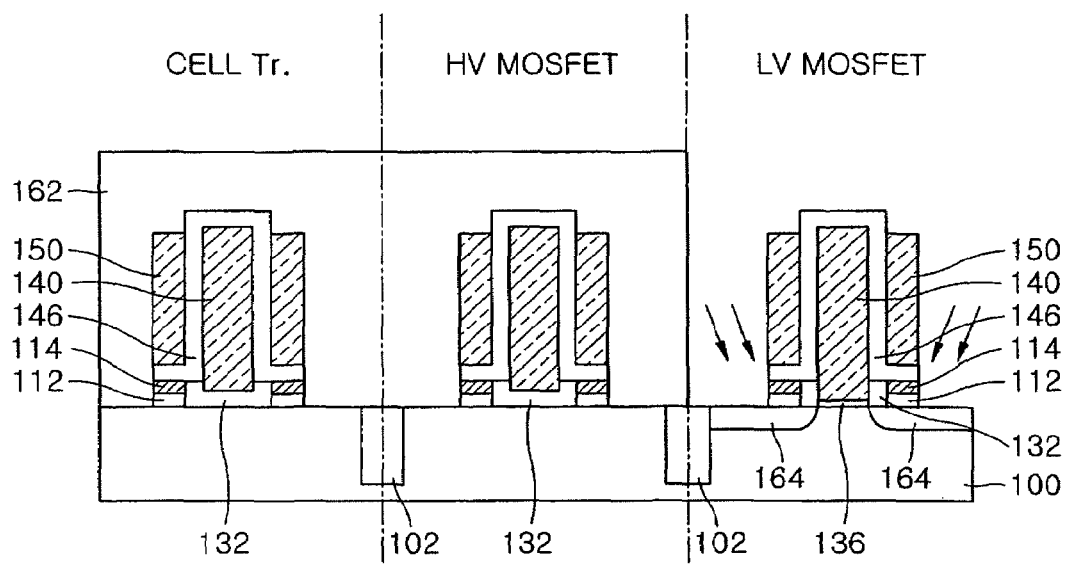
Figure 1K:
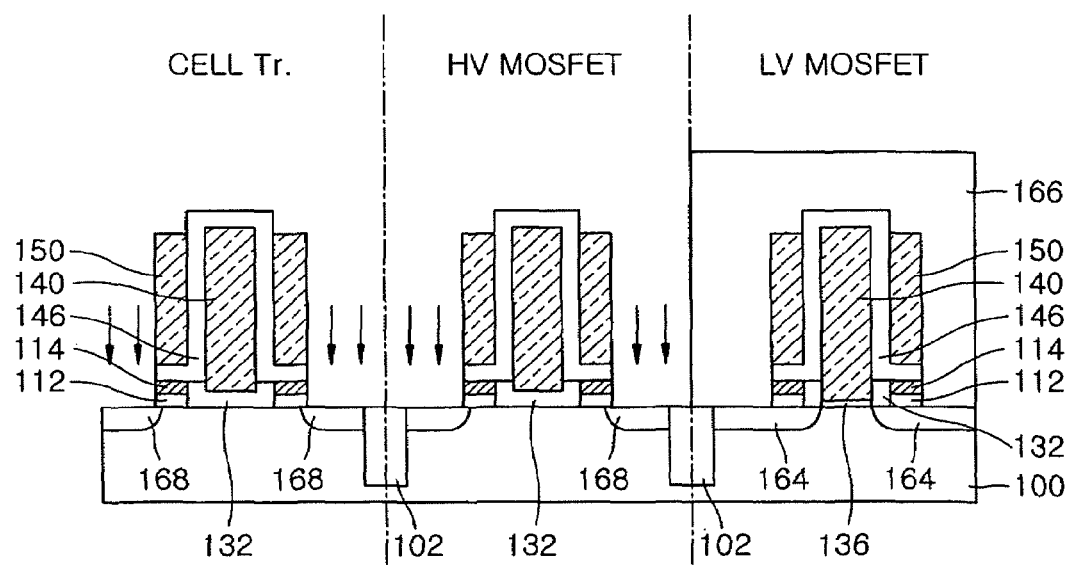
Figure 1L:
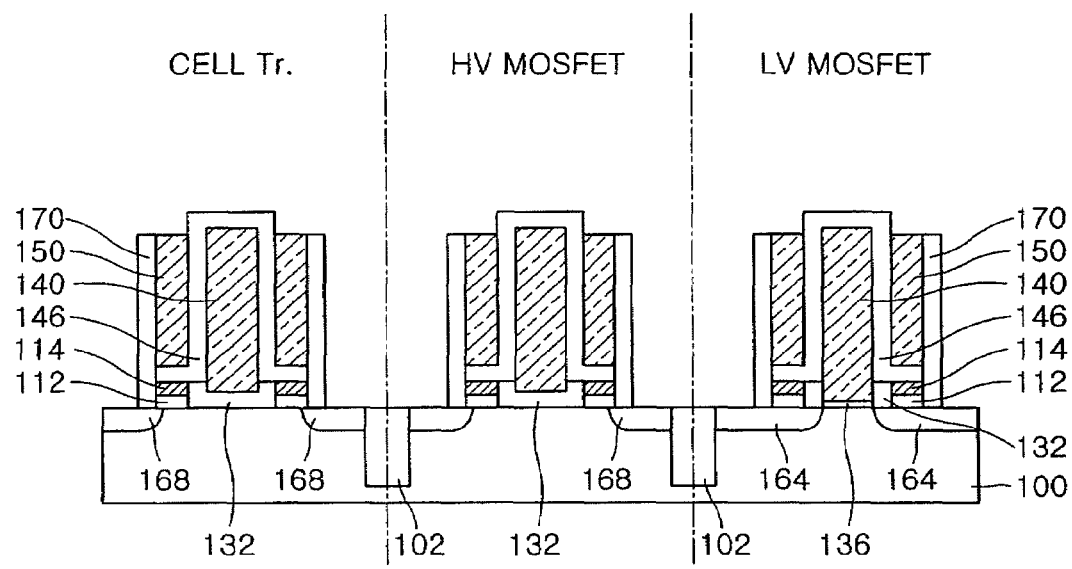
Figure 1M:
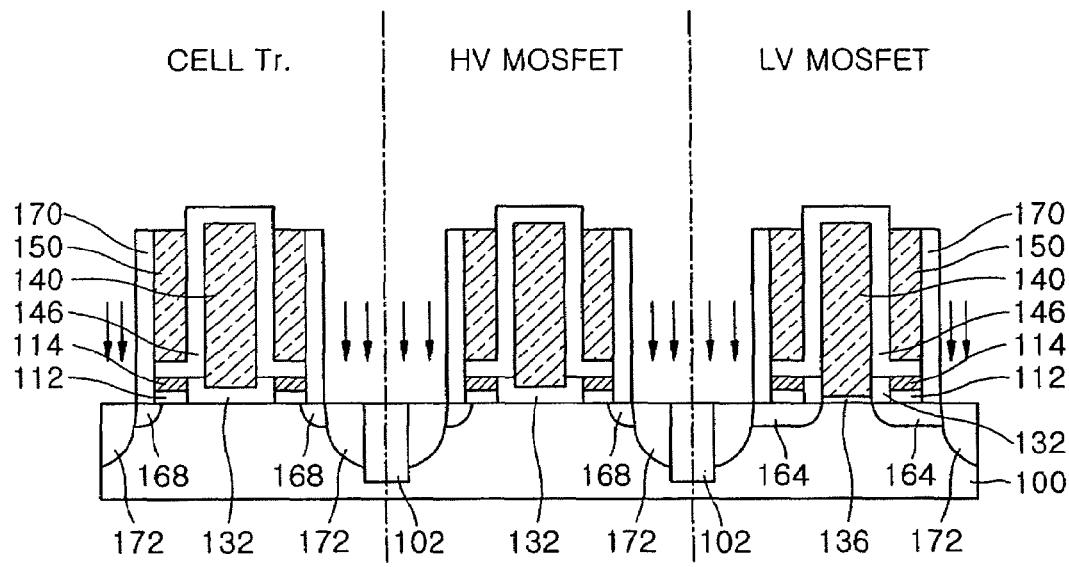
Figure 1N:
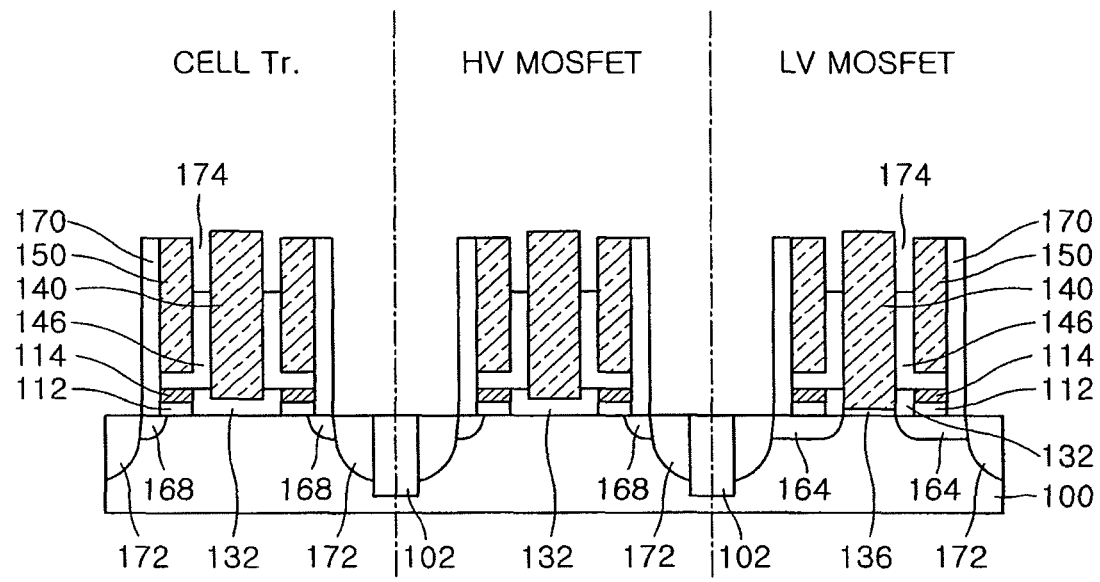
Figure 1O:
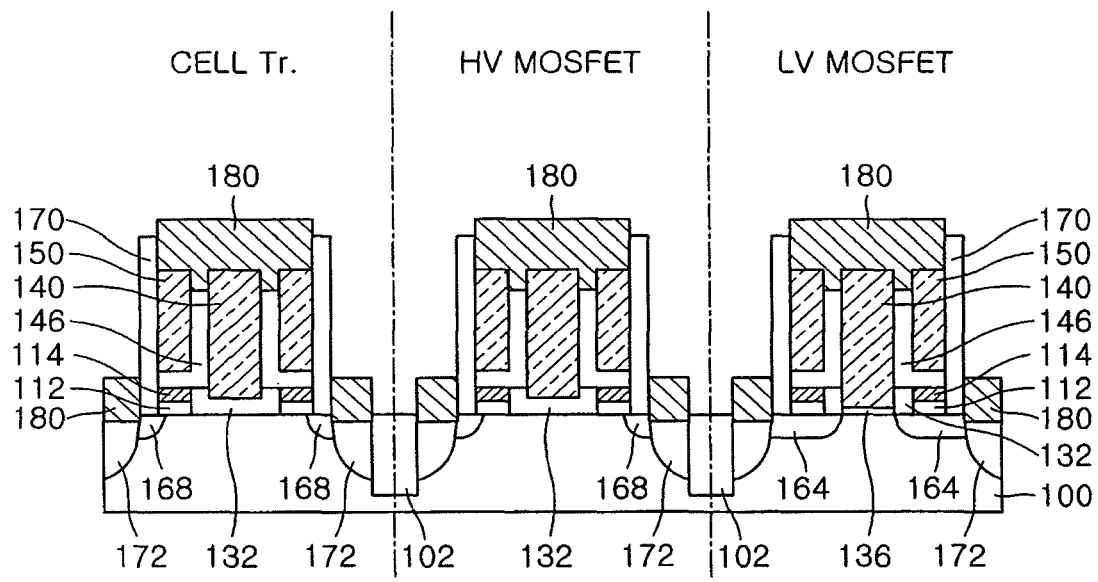

FIGS. 1A through 1O are cross-sectional views illustrating a method of manufacturing a semiconductor device according an embodiment of the present invention. The embodiment illustrated in FIGS. 1A through 1O is an example of process integration to simultaneously form a cell transistor on a cell array area and a high voltage (HV) transistor and a low voltage (LV) transistor on a peripheral circuit area. In the embodiment illustrated in FIGS. 1A through 1O, the cell transistor, the HV transistor, and the LV transistor each have notch gate structures and have gate insulation films of different thicknesses depending on functions of the three transistors.

Referring to FIG. 1A, isolation areas 102 are formed in a semiconductor substrate 100 including a cell array area and a peripheral circuit area and a core area (hereinafter, both referred to as a peripheral circuit area), for example, in a silicon substrate, to define active areas of the semiconductor substrate 100. In this embodiment, a cell transistor (CELL Tr.) is formed on the cell array area of the semiconductor substrate 100, and an HV transistor (HV MOSFET) and an LV transistor (LV MOSFET) are formed in the peripheral circuit area.

Referring to FIG. 1B, a lower oxide film 112, a memory layer 114, and an upper oxide film 116 are sequentially formed on the entire surface of the semiconductor substrate 100. The lower oxide film 112 serves as a tunnel and may have a thickness of about 20-100 Å. The memory layer 114 traps charge carriers, so it may be formed of any material capable of storing charges, for example, silicon nitride, amorphous silicon, polycrystalline silicon, silicon dots, SiGe, nano-crystal, or metal. Preferably, the memory layer 114 may be formed of silicon nitride. The memory layer 114 may have a thickness of about 50-100 Å. The upper oxide film 116 may have a thickness of about 50-250 Å.

Referring to FIG. 1C, a dummy pattern 120 is formed on the upper oxide film 116. In a subsequent process, the dummy pattern 120 serves as a mold to form a gate of a transistor using a damascene process. Openings 120h of the dummy pattern 120 are formed at locations over the semiconductor substrate 100 where gates are formed. Because the dummy pattern 120 needs to be selectively removed after forming the gates, the dummy pattern 120 may be formed of a material having an etch selectivity with respect to the upper oxide film 116, for example, silicon nitride. The thickness of the dummy pattern 120 depends upon a height of each of the gates.

Referring to FIG. 1D, portions of the upper oxide film 116, the memory layer 114, and the lower oxide film 112 exposed through the openings 120h are removed using the dummy pattern 120 as an etch mask, so that an upper surface of the semiconductor substrate 100 is exposed through the openings 120h.

Referring to FIG. 1E, a first insulation film 132, which is relatively thick, is formed on the exposed upper surface of the semiconductor substrate 100 and the dummy pattern 120. The first insulation film 132 constitutes a gate insulation film for both the cell transistor on the cell array area and the HV transistor on the peripheral circuit area. The first insulation film 132 may be formed of a silicon oxide film having a relatively large thickness of about 50-250 Å. Thereafter, a portion of the first insulation film 132 in only an area of the peripheral circuit area on which the LV transistor is to be formed is removed using a first photo resist pattern 134 as an etch mask by dry-etching, so that the upper surface of the semiconductor substrate 100 in the area of the peripheral circuit area on which the LV transistor is to be formed is exposed again through the openings 120h. Consequently, the first insulation film 132 remains as spacers only on sidewalls of the dummy pattern 120 in the area where the LV MOSFET is to be formed. Thereafter, a second insulation film 136 is formed on the exposed surface of the semiconductor substrate 100 in the area where the LV MOSFET is to be formed. The second insulation film 136 constitutes a gate insulation film for the LV transistor on the peripheral circuit area and is thinner than the first insulation film 132. For example, the second insulation film 136 may have a thickness in the range of about 20-100 Å. The second insulation film 136 may be formed of a silicon oxide film by thermal oxidation.

Referring to FIG. 1F, the first photoresist pattern 134 is removed, and a conductive material for gate formation is deposited in the openings 120h and on the dummy pattern 120 to form a first conductive layer 140. Thereafter, the first conductive layer 140 is polished by chemical mechanical polishing so that the first conductive layer 140 remains only in the openings 120h. Portions of the first conductive layer 140 remaining in the openings 120h constitute gates of the transistors formed on the cell array area and the peripheral circuit area. The first conductive layer 140 may be formed of doped polysilicon, metal, or metal silicide. To protect the surface of the remaining first conductive layer 140, an oxide film 142 is formed on the first conductive layer 140.

Referring to FIG. 1G, the oxide layer 142 and the dummy pattern 120 are sequentially removed by wet etching to expose the upper oxide film 116.

Referring to FIG. 1H, exposed portions of the first insulation film 132 and the upper oxide film 116 are removed by stripping, and a third insulation film 146 is formed on the resultant substrate 100. The third insulation film 146 may be an oxide film formed by chemical vapor deposition (CVD) or atomic layer deposition (ALD). The removal of the exposed portions of the first insulation film 132 and the upper oxide film 116 and the formation of the third insulation film 146 may be omitted in some cases.

A conductive material is deposited on the entire surface of the resultant substrate 100 on which the third insulation film 146 has been formed and etched back so that second conductive layers 150 in the shape of spacers remain on portions of the third insulation film 146 that contact sidewalls of the first conductive layer 140. The second conductive layer 150 may be formed of doped polysilicon, metal, or metal silicide.

In this way, gates each comprised of the first conductive layer 140 and the second conductive layer 150 are formed on the cell array area and the peripheral circuit area. Hence, each of the gates has a notch gate structure in which a distance between the semiconductor substrate 100 and the second conductive layer 150 is greater than that between the semiconductor substrate 100 and the first conductive layer 140.

Referring to FIG. 1I, exposed portions of the third insulation film 146, the memory layer 114, and the lower oxide film 112 around the spacers of the second conductive layer 150 are removed to expose the upper surface of the semiconductor substrate 100.

Referring to FIG. 1J, the cell array area and an area of the peripheral circuit area on which the HV MOSFET is to be formed are covered with a second photoresist pattern 162 to expose only the area on which the LV MOSFET is to be formed. The resultant semiconductor substrate 100 undergoes lightly doped drain (LDD) ion implantation and halo ion implantation using the second photoresist pattern 162, the first conductive layer 140, and the second conductive layer 150 as an ion implantation mask, thereby forming extension areas 164 within the area of the semiconductor substrate 100 on which the LV MOSFET is to be formed. The LDD ion implantation and halo ion implantation is performed according to inclined ion implantation so that the extension areas 164 can extend up to an area under the memory layer 114. The extension areas 164 define a channel region having a relatively small length in the area on which the LV MOSFET is to be formed.

Referring to FIG. 1K, the second photoresist pattern 162 is removed, and the area of the peripheral circuit area on which the LV MOSFET is to be formed is covered with a third photoresist pattern 166 to expose the cell array area and the area of the peripheral circuit area on which the HV MOSFET is to be formed. The resultant structure undergoes LDD ion implantation and halo ion implantation using the third photoresist pattern 166, the first conductive layer 140, and the second conductive layer 150 as an ion implantation mask, thereby forming extension areas 168 within the cell array area and the area of the peripheral circuit area on which the HV MOSFET is to be formed. In this ion implantation process, inclined ion implantation is not performed, so a channel region defined by the extension areas 168 in the cell array area and the area of the peripheral circuit area of the semiconductor substrate 100 on which the HV MOSFET is to be formed is relatively long. That is, the length of the channel region defined by the extension areas 164 in the area on which the LV MOSFET is to be formed is smaller than that of the channel region defined by the extension areas 168.

Referring to FIG. 1L, the third photoresist pattern 166 is removed. Then, an insulative material is deposited on the entire surface of the resultant structure and etched back to form insulation spacers 170 on sidewalls of the second conductive layer 150. The insulation spacers 170 may be an oxide film, a nitride film, or a combination of these films. When the third insulation film 146 is an oxide film, the insulation spacers 170 may be a nitride film to have an etch selectivity with respect to the third insulation film 146.

Referring to FIG. 1M, ions are implanted into the semiconductor substrate 100 using the first conductive layer 140, the second conductive layer 150, and the insulation spacers 170 as an ion implantation mask, thereby forming a source/drain region 172 in the cell array area and the peripheral circuit area of the semiconductor substrate 100.

Referring to FIG. 1N, some exposed portions of the third insulation film 146 on the first conductive layer 140 are etched by wet or dry etching, thereby forming recesses 174 between the first and second conductive layers 140 and 150.

Referring to FIG. 1O, metal silicide films 180 are formed on the first and second conductive layers 140 and 150 and the source/drain regions 172 using a typical salicide process. The metal silicide films 180 electrically connect the first conductive layer 140 to the second conductive layer 150. The metal silicide films 180 may be formed of cobalt silicide, nickel silicide, or titanium silicide.

In the above-described semiconductor device manufacturing method according to the embodiment illustrated in FIGS. 1A through 1O, the cell transistor formed on the cell array area and the HV MOSFET formed on the peripheral circuit area include as a gate insulation film the first insulation films 132 having a relatively large thickness, so that a gate insulation film of a relatively large thickness can be formed. The LV MOSFET formed on the peripheral circuit area includes as a gate insulation film the second insulation films 136 having a relatively small thickness, so that a gate insulation film of a relatively small thickness can be formed. The extension areas 168 of the cell transistor and the extension area 168 of the HV MOSFET are formed under edges of the memory layers 114, while the extension areas 164 of the LV MOSFET are formed directly under the memory layers 114. Hence, a high-performance transistor can be formed in the LV MOSFET operating with a low voltage. As described above, in the above-described semiconductor device manufacturing method according to the embodiment illustrated in FIGS. 1A through 1O, transistors having different structures depending on the functions of the transistors can be formed in the cell array area and the peripheral circuit area by efficient process integration.

FIGS. 2A through 2H are cross-sectional views illustrating a method of manufacturing a semiconductor device according another embodiment of the present invention. This embodiment is an example of process integration to simultaneously form a cell transistor on a cell array area and a HV transistor and a LV transistor on a peripheral circuit area. In this embodiment, the cell transistor, the HV transistor, and the LV transistor each have notch gate structures, and gate insulation films thereof have different thicknesses depending on functions of the three transistors. This embodiment is mostly the same as the previous embodiment except that a process of completely removing a memory layer in the peripheral circuit area is included. Like reference numerals in the drawings denote like elements, and thus their description will not be repeated.

Figure 2A:
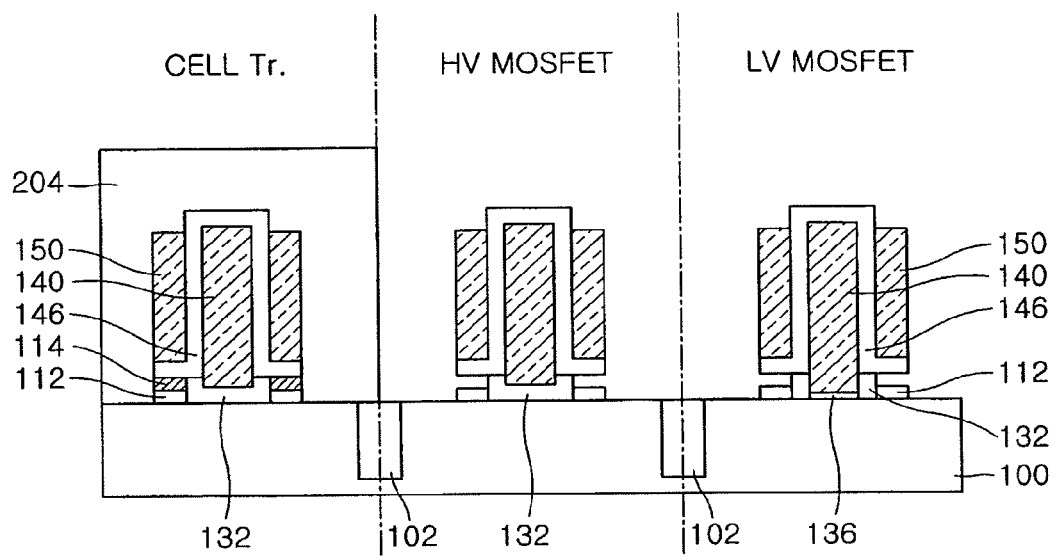
FIGS. 2A through 2H are cross-sectional views illustrating a method of manufacturing a semiconductor device according to another embodiment of the present invention.

Referring to FIG. 2A, a portion of the memory layer 114 under the second conductive layer 150 is exposed in the cell array area and the peripheral circuit area of the semiconductor substrate 100 by performing the processes illustrated in FIGS. 1A through 1I.

Thereafter, the cell array area is covered with a fourth photoresist pattern 204 to protect the memory layer 114 on the cell array area. In this state, the memory layer 114 formed on the peripheral circuit area is removed by wet etching. When the memory layer 114 is a silicon nitride film, a solution used in the wet etching may be phosphoric acid ($H_3PO_4$).

Figure 2B:
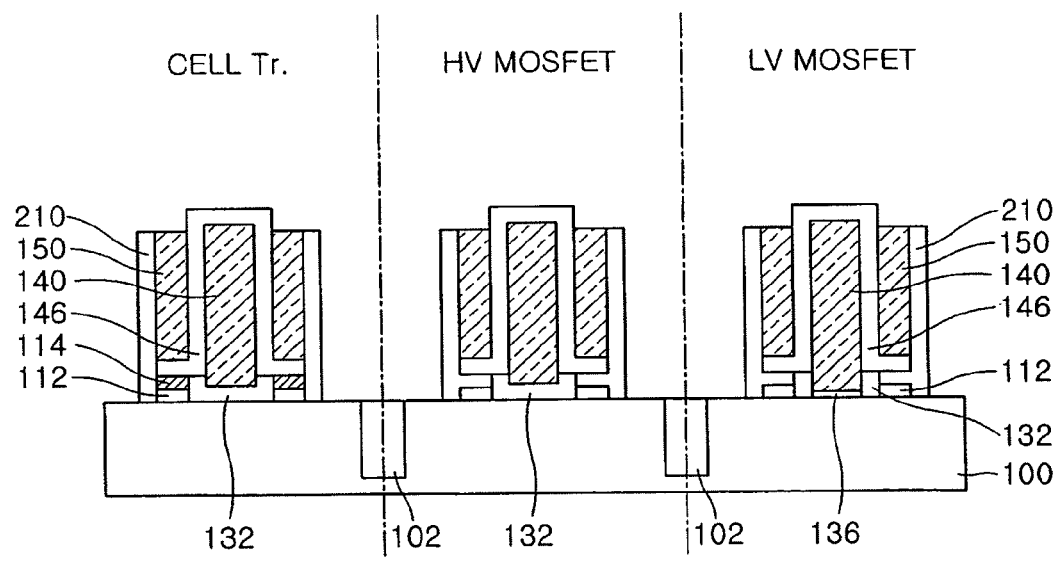

Referring to FIG. 2B, the fourth photoresist pattern 204 is removed. Then, an insulative material is deposited on the entire surface of the cell array area and the peripheral circuit area so that empty spaces resulting from the removal of the memory layer 114 on the peripheral circuit area can be filled with the insulative material. Thereafter, the insulative material is etched back to form insulation liners 210 on sidewalls of the second conductive layer 150. The insulation liners 210 may be an oxide film.

Figure 2C:
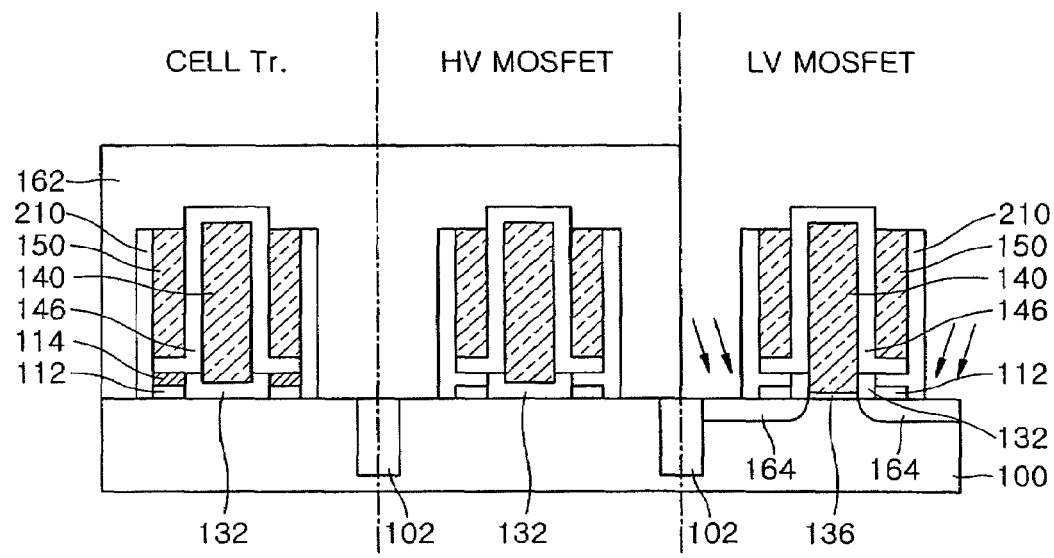

Referring to FIG. 2C, similar to the process illustrated in FIG. 1J, the area of the peripheral circuit area on which the LV MOSFET is to be formed undergoes LDD ion implantation and halo ion implantation, thereby forming the extension areas 164 within the area of the semiconductor substrate 100 on which the LV MOSFET is to be formed.

Figure 2D:
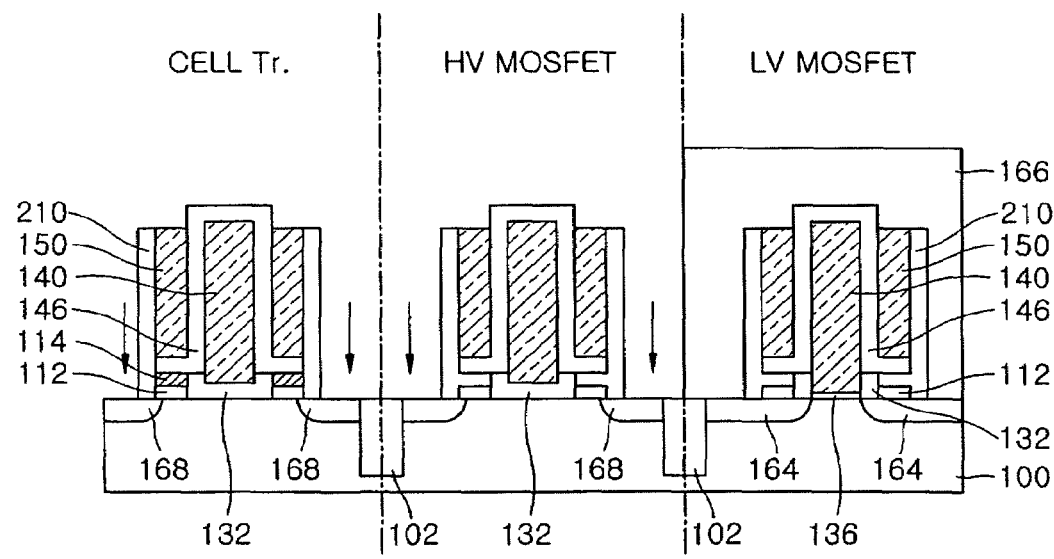

Referring to FIG. 2D, similar to the process illustrated in FIG. 1K, the cell array area and the area of the peripheral circuit area on which the HV MOSFET is to be formed undergo LDD ion implantation and halo ion implantation, thereby forming the extension areas 168 within the cell array area and the area of the peripheral circuit area on which the HV MOSFET is to be formed.

Figure 2E:
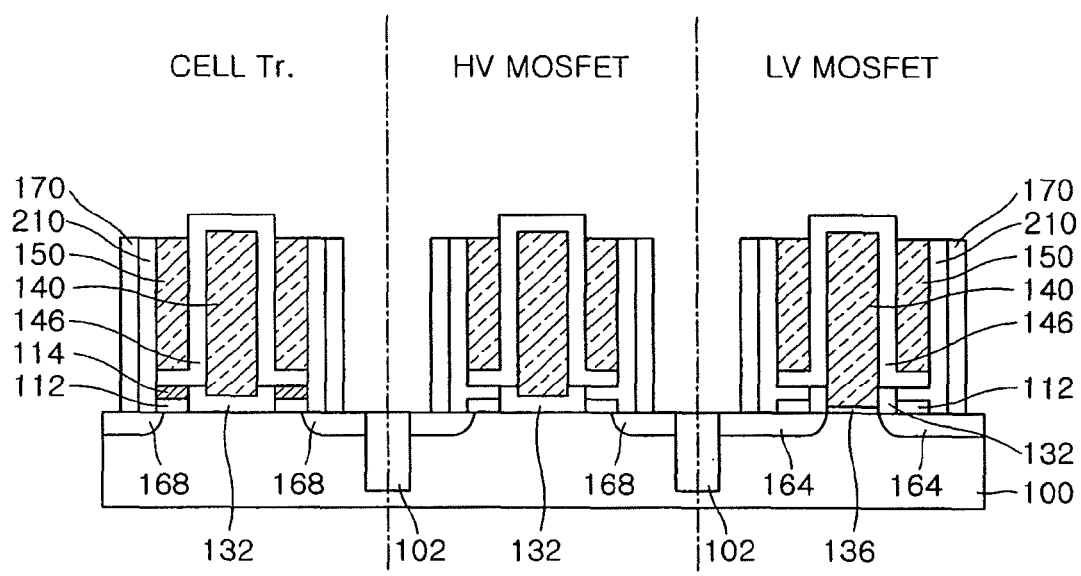

Referring to FIG. 2E, similar to the process illustrated in FIG. 1L, the insulation spacers 170 are formed on sidewalls of the insulation liners 210.

Figure 2F:
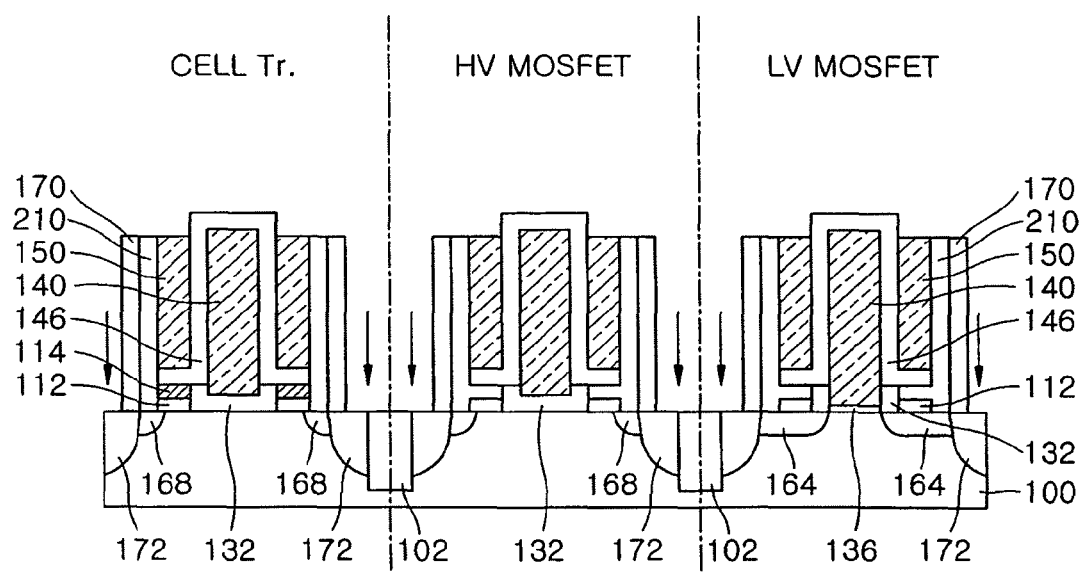

Referring to FIG. 2F, similar to the process illustrated in FIG. 1M, the source/drain region 172 is simultaneously formed in the cell array area and the peripheral circuit area of the semiconductor substrate 100.

Figure 2G:
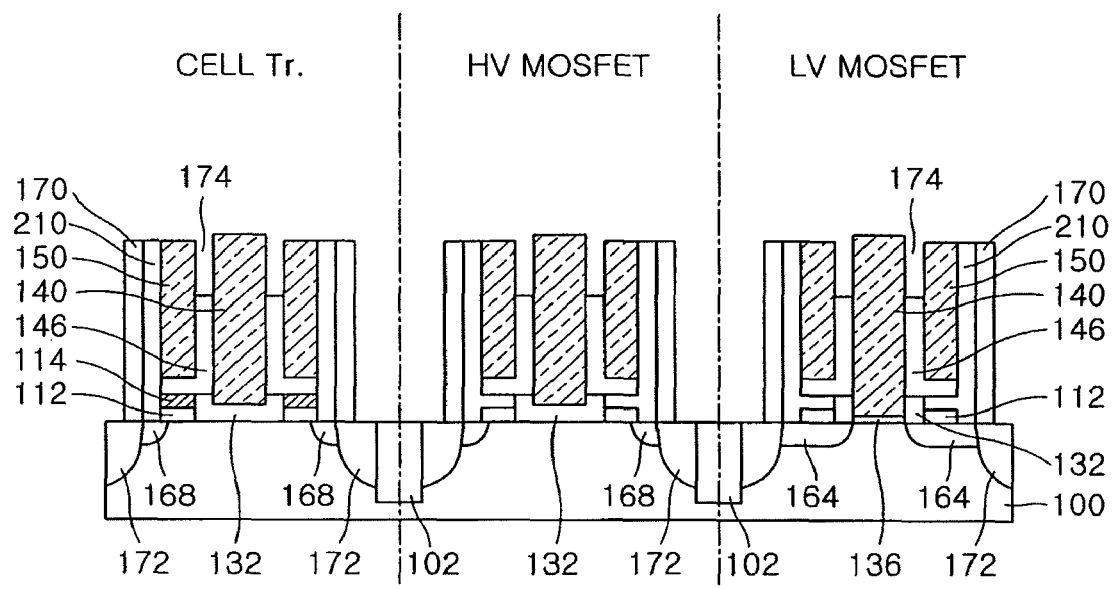

Referring to FIG. 2G, similar to the process illustrated in FIG. 1N, the recesses 174 are formed between the first and second conductive layers 140 and 150 by etching portions of the third insulation film 146.

Figure 2H:
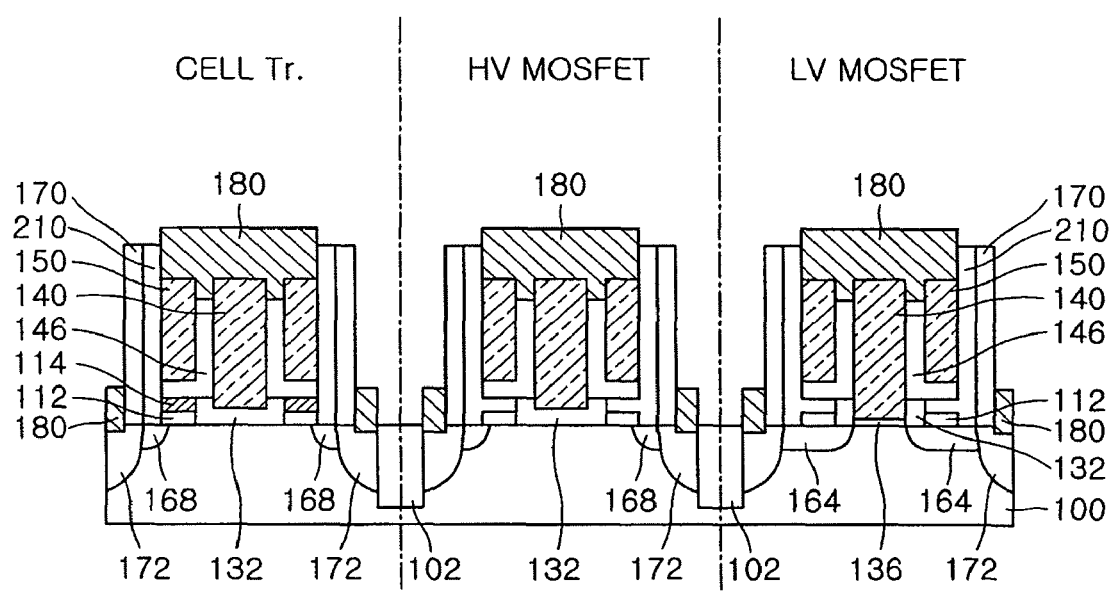

Referring to FIG. 2H, similar to the process illustrated in FIG. 1O, the metal suicide films 180 are formed on the first and second conductive layers 140 and 150 and the source/drain regions 172.

In the above-described semiconductor device manufacturing method according to the embodiment illustrated in FIGS. 2A through 2H, similar to the embodiment illustrated in FIGS. 1A through 1O, the cell transistor formed on the cell array and the HV MOSFET formed on the peripheral circuit area include as a gate insulation film the first insulation films 132 having a relatively large thickness, so that a gate insulation film of a relatively large thickness can be formed. The LV MOSFET formed on the peripheral circuit area includes as a gate insulation film the second insulation films 136 having a relatively small thickness, so that a gate insulation film of a relatively small thickness can be formed. The extension areas 168 of the cell transistor and the extension area 168 of the HV MOSFET are formed under edges of the memory layers 114. The extension areas 164 of the LV MOSFET are separated from each other a shorter distance than that for the extension areas 168. Hence, a high-performance transistor can be formed in the LV MOSFET operating with a low voltage. As described above, in the above-described semiconductor device manufacturing method according to the embodiment illustrated in FIGS. 2A through 2H, transistors having different structures depending on the functions of the transistors can be formed in the cell array area and the peripheral circuit area by efficient process integration.

Additionally, in the above-described semiconductor device manufacturing method according to the embodiment illustrated in FIGS. 2A through 2H, the memory layer 114 remain under the second conductive layer 150 which constitutes the cell transistor on the cell array area, while no memory layers 114 remain under the second conductive layers 150 that constitute the HV MOSFET and the LV MOSFET on the peripheral circuit area. If the memory layer 114 remains in the HV MOSFET, charges may be stored in the memory layer 114 by Fowler-Nordheim (FN) or channel hot-electron injection (CHEI) when the HV MOSFET operates. This may change a threshold voltage Vth of a peripheral circuit and hinder an electrical operation of the peripheral circuit. Also, a distribution of an electrical performance of the semiconductor device may deteriorate. However, these problems can be prevented in the embodiment illustrated in FIGS. 2A through 2H because no memory layers 114 remain on the peripheral circuit area.

FIGS. 3A through 3K are cross-sectional views illustrating a method of manufacturing a semiconductor device according to another embodiment of the present invention. This embodiment is an example of process integration to simultaneously form a cell transistor on a cell array area and a HV transistor and a LV transistor on a peripheral circuit area. In this embodiment, the cell transistor, the HV transistor, and the LV transistor each have notch gate structures, and gate insulation films thereof have different thicknesses depending on functions of the three transistors. As in the embodiment illustrated in FIGS. 2A through 2H, this embodiment includes a process of completely removing a memory layer from the transistor formed on the peripheral circuit area. This embodiment is different from the embodiment illustrated in FIGS. 2A through 2H in that an insulation film interposed between the first and second conductive layers 140 and 150 on the peripheral circuit area is removed. Like reference numerals in the drawings denote like elements, and thus their description will not be repeated.

Figure 3A:
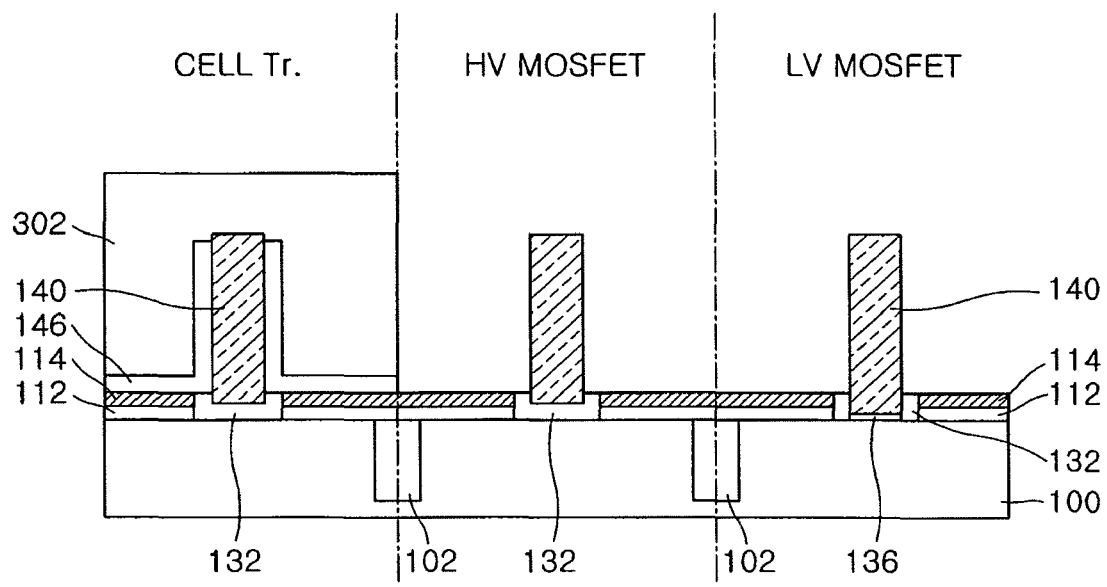
FIGS. 3A through 3K are cross-sectional views illustrating a method of manufacturing a semiconductor device according to another embodiment of the present invention.

Referring to FIG. 3A, the dummy pattern 120 is removed to expose the upper oxide film 116 on the semiconductor substrate 100 by performing the processes illustrated in FIGS. 1A through 1G.

Thereafter, a fifth photoresist pattern 302 is formed to cover the cell array area, and the third insulation film 146 that covers the sidewalls of the first conductive layer 140 on the peripheral circuit area is removed using the fifth photoresist pattern 302 as an etch mask.

Figure 3B:
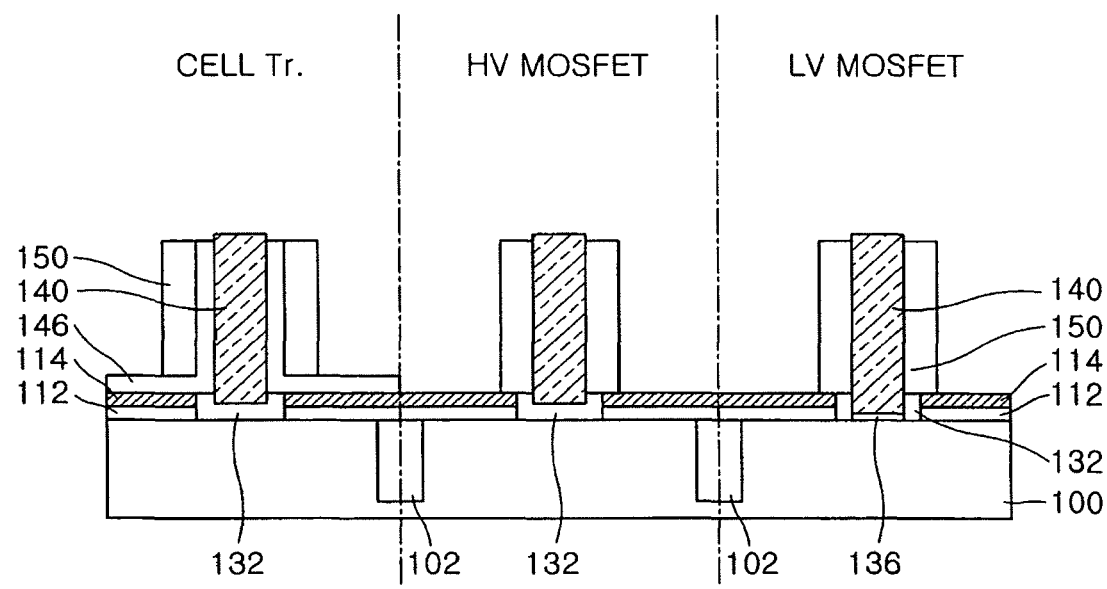

Referring to FIG. 3B, the fifth photoresist pattern 302 is removed, and then the second conductive layer 150 in the shape of spacers is formed on sidewalls of the first conductive layer 140 using the same method as described with reference to FIG. 1H. As a result, the second conductive layer 150 on the cell array area is formed on portions of the third insulation film 146 that contact sidewalls of the first conductive layer 140. On the other hand, the second conductive layer 150 on the peripheral circuit area is formed directly on the sidewalls of the first conductive layer 140.

Figure 3C:
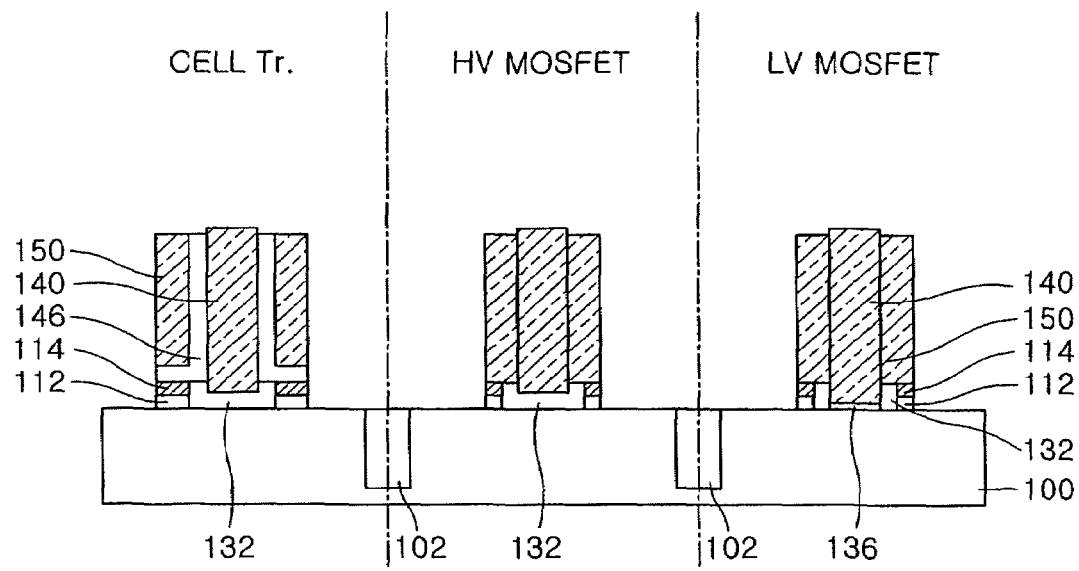

Referring to FIG. 3C, exposed portions of the third insulation film 146, the memory layer 114, and the lower oxide film 112 around the spacers of the second conductive layer 150 are removed to expose the upper surface of the semiconductor substrate 100 using the same method as described with reference to FIG. 1I.

Figure 3D:
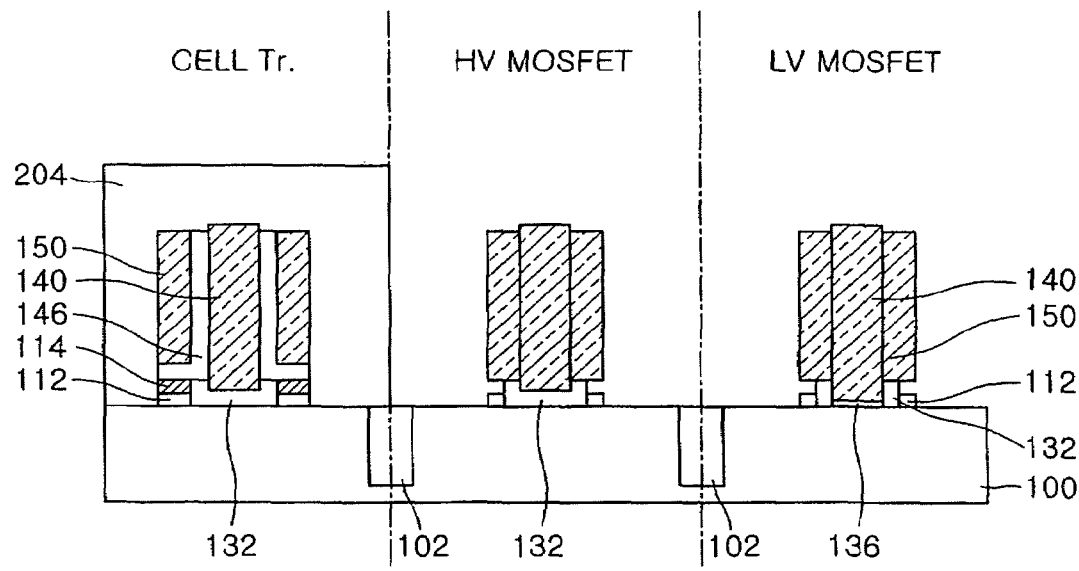

Referring to FIG. 3D, the memory layer 114 formed on the peripheral circuit area is removed by wet etching using the same method as described with reference to FIG. 2A.

Figure 3E:
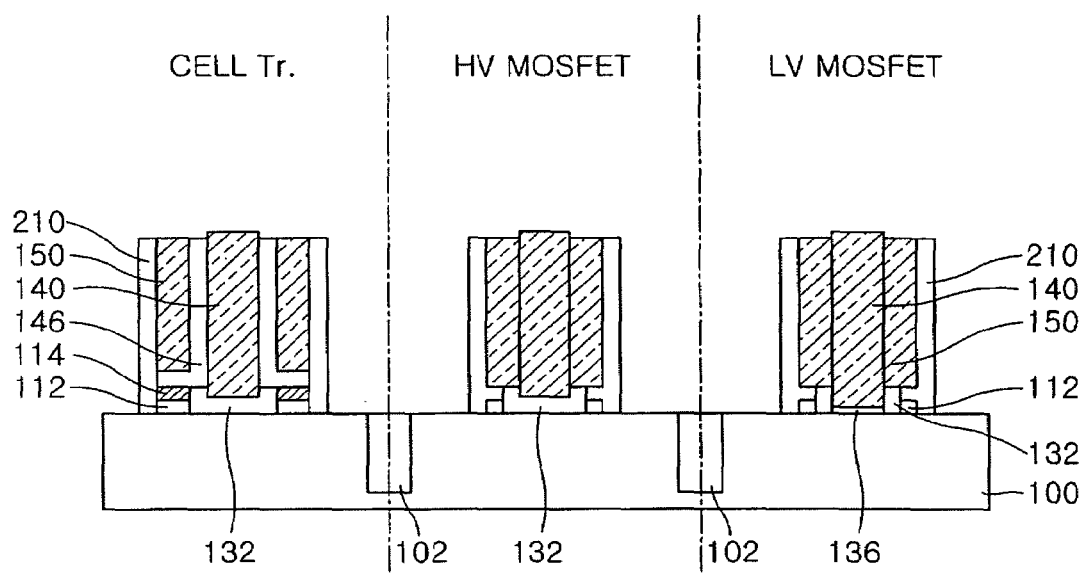

Referring to FIG. 3E, the insulation liners 210 are formed on the sidewalls of the second conductive layer 150 using the same method as described with reference to FIG. 2B.

Figure 3F:
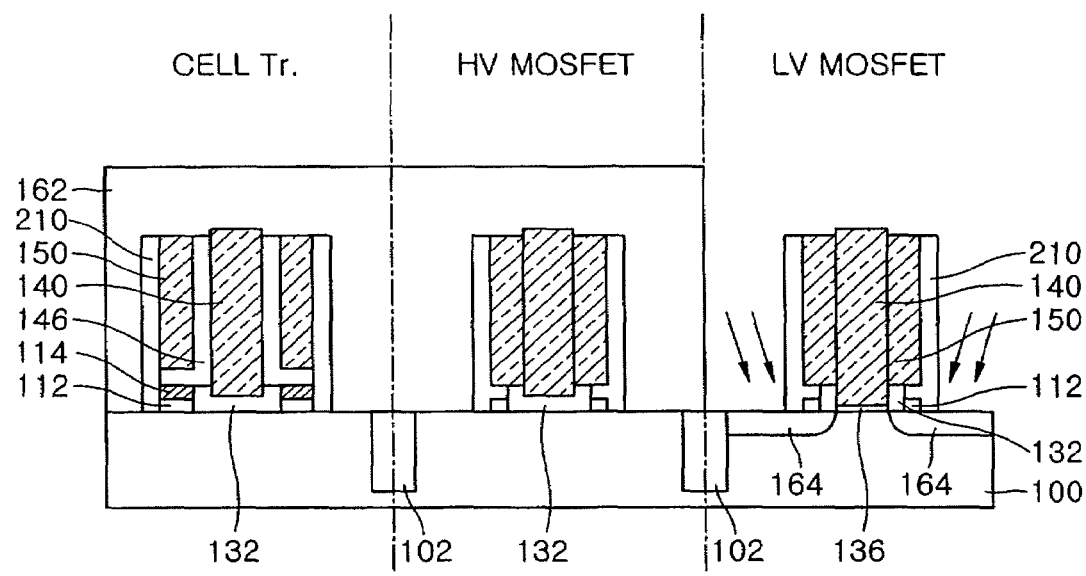

Referring to FIG. 3F, the area of the peripheral circuit area on which the LV MOSFET is to be formed undergoes LDD ion implantation and halo ion implantation using the same method as described with reference to FIG. 2C, thereby forming the extension areas 164 within the area of the semiconductor substrate 100 on which the LV MOSFET is to be formed.

Figure 3G:
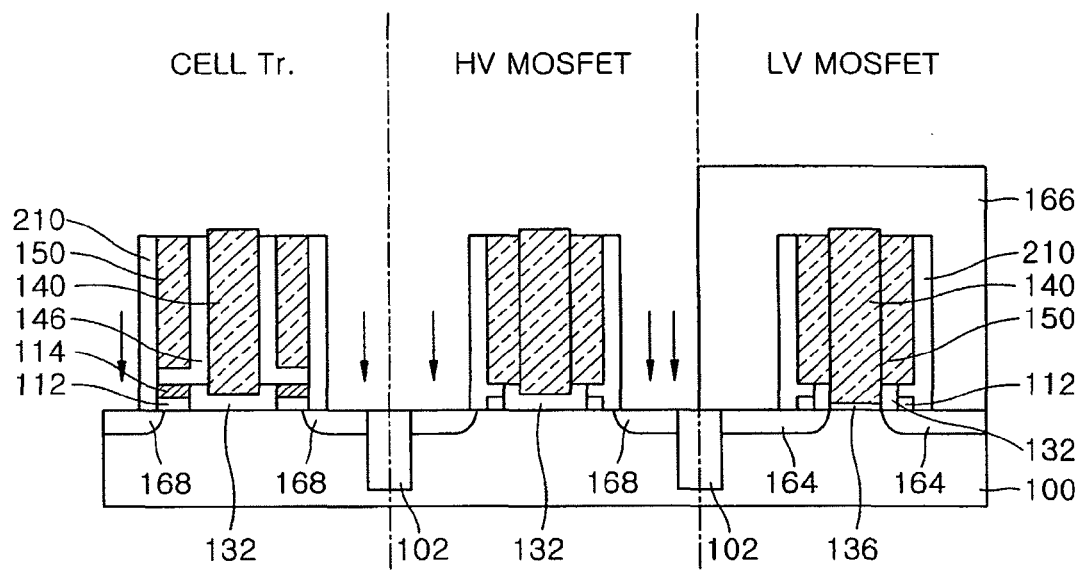

Referring to FIG. 3G, the cell array area and the area of the peripheral circuit area on which the HV MOSFET is to be formed undergo LDD ion implantation and halo ion implantation using the same method as described with reference to FIG. 2D, thereby forming the extension areas 168 within the cell array area and the area of the peripheral circuit area on which the HV MOSFET is to be formed.

Figure 3H:
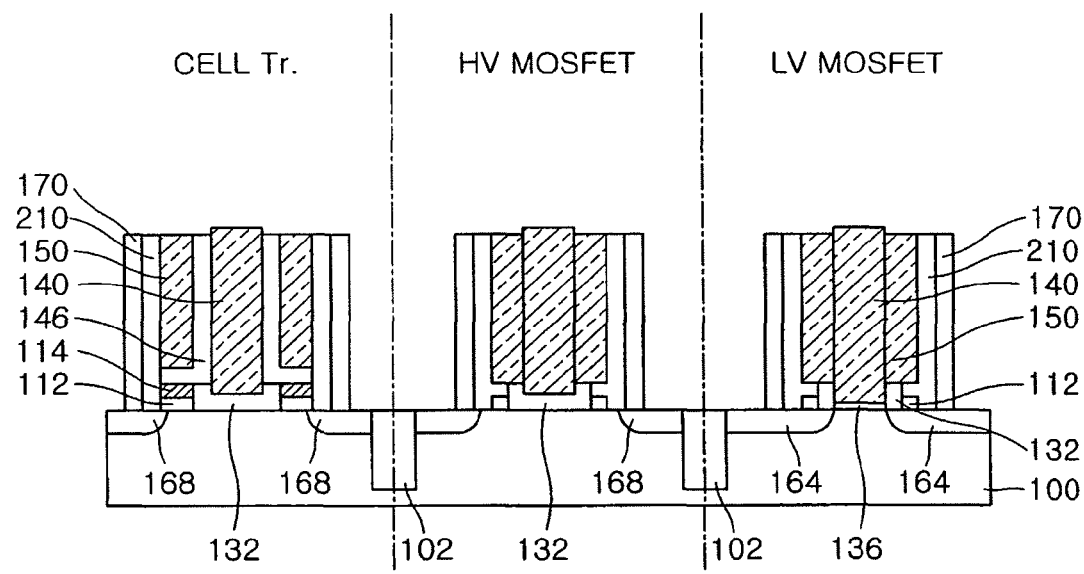

Referring to FIG. 3H, the insulation spacers 170 are formed on the sidewalls of the insulation liners 210 using the same method as described with reference to FIG. 2E.

Figure 3I:
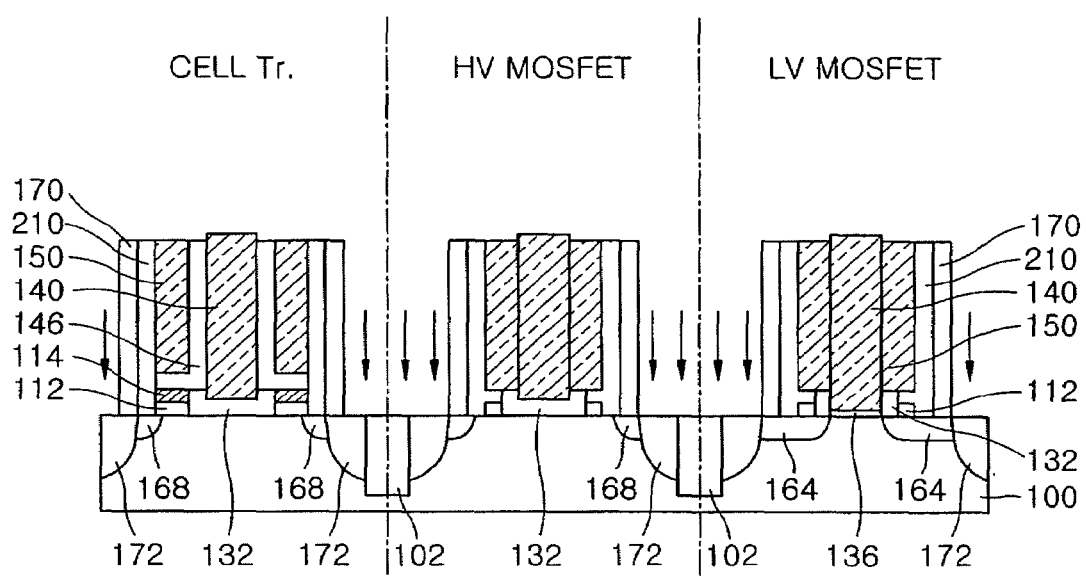

Referring to FIG. 3I, the source/drain region 172 is simultaneously formed in the cell array area and the peripheral circuit area of the semiconductor substrate 100 using the same method as described with reference to FIG. 2F.

Figure 3J:
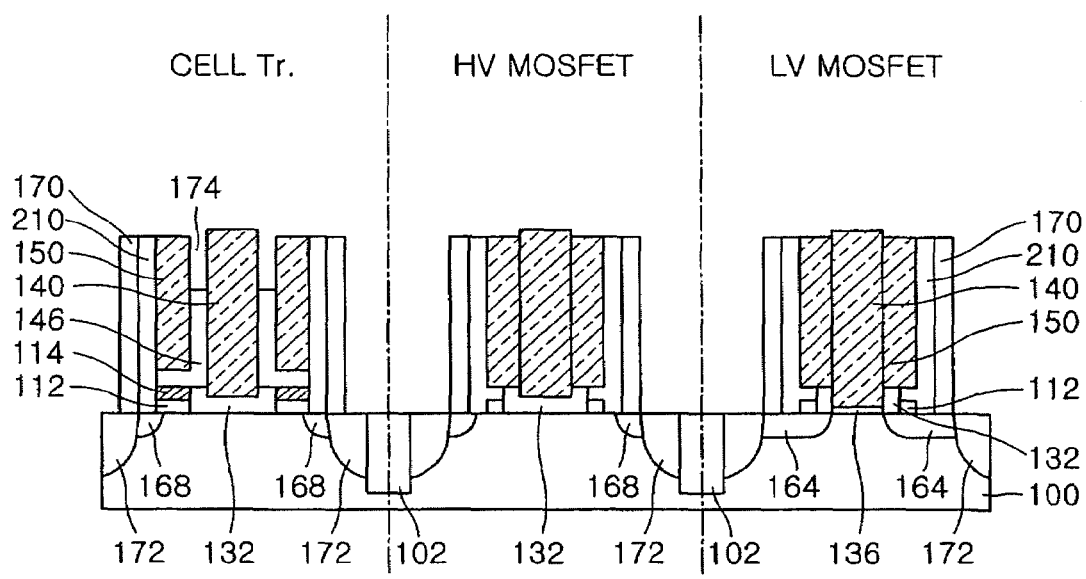

Referring to FIG. 3J, some exposed portions of the third insulation film 146 are etched using the same process as described with reference to FIG. 2G, thereby forming recesses 174 between the first and second conductive layers 140 and 150.

Figure 3K:
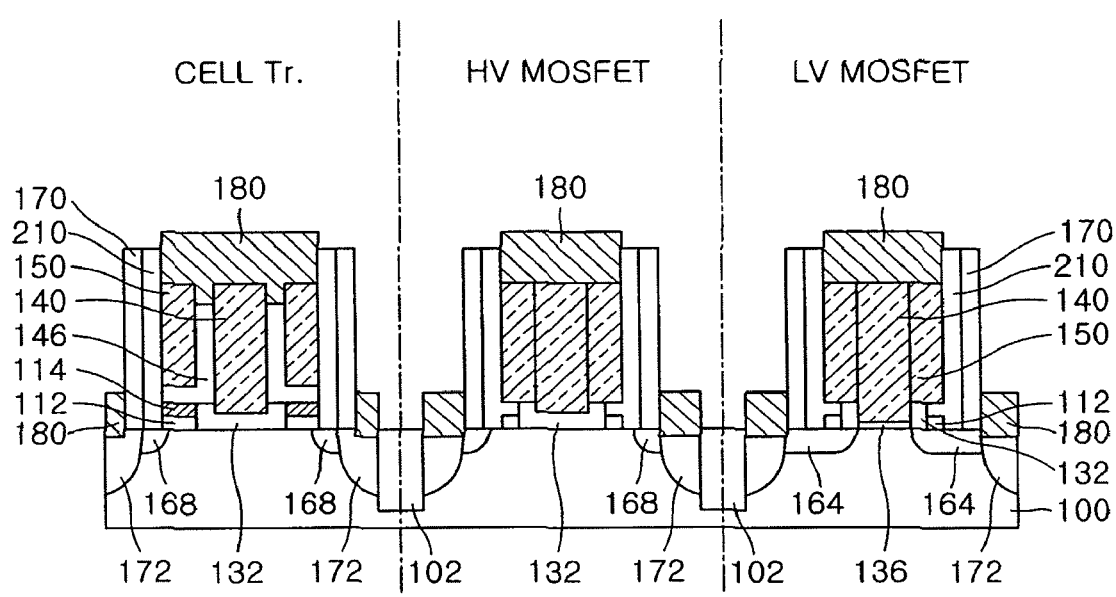

Referring to FIG. 3K, the metal silicide films 180 are formed on the first and second conductive layers 140 and 150 and the source/drain regions 172 using the same method as described with reference to FIG. 2H. As a result, in the cell array area, the first conductive layer 140 is electrically connected to the second conductive layer 150 by the metal silicide film 180.

In the above-described semiconductor device manufacturing method according to the embodiment illustrated in FIGS. 3A through 3K, the cell transistor formed on the cell array and the HV MOSFET formed on the peripheral circuit area include as a gate insulation film the first insulation films 132 having a relatively large thickness, so that a gate insulation film of a relatively large thickness can be formed. The LV MOSFET formed on the peripheral circuit area includes as a gate insulation film the second insulation films 136 having a relatively small thickness, so that a gate insulation film of a relatively small thickness can be formed. The extension areas 168 of the cell transistor are formed under the outside of the memory layers 114, while the extension areas 164 of the LV MOSFET are separated from each other a shorter distance than the distance between the extension areas 168. Hence, a high-performance transistor can be formed in the LV MOSFET operating with a low voltage. As described above, in the above-described semiconductor device manufacturing method according to the embodiment illustrated in FIGS. 3A through 3K, transistors having different structures depending on the functions of the transistors can be easily formed in the cell array area and the peripheral circuit area by efficient process integration. Furthermore, in this embodiment, the memory layer 114 remain under the second conductive layer 150 which constitutes the cell transistor on the cell array area, while no memory layers 114 remain under the second conductive layers 150 that constitute the HV MOSFET and the LV MOSFET on the peripheral circuit area. This prevents degradation of the electrical performance of a peripheral circuit.

Particularly, in the above-described semiconductor device manufacturing method according to the embodiment illustrated in FIGS. 3A through 3K, an unnecessary insulation film between the first and second conductive layers 140 and 150 is removed in full consideration of the characteristics of a peripheral circuit that needs no storage nodes. Hence, the peripheral circuit area may not undergo the process of forming the metal suicide films 180 as described with reference to FIG. 3K.

Figure 4A:
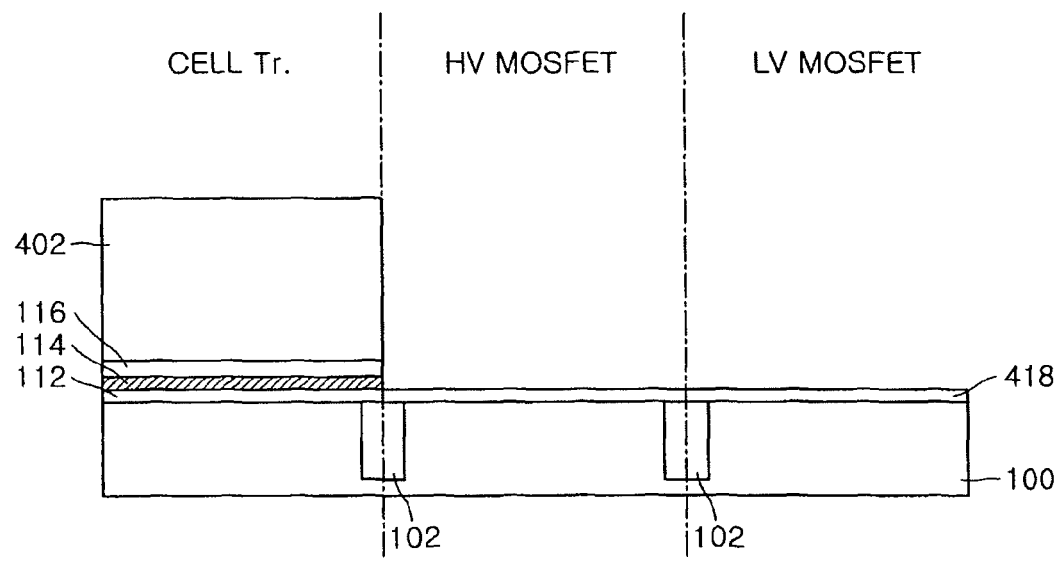
FIGS. 4A through 4N are cross-sectional views illustrating a method of manufacturing a semiconductor device according to another embodiment of the present invention.
Figure 4B:
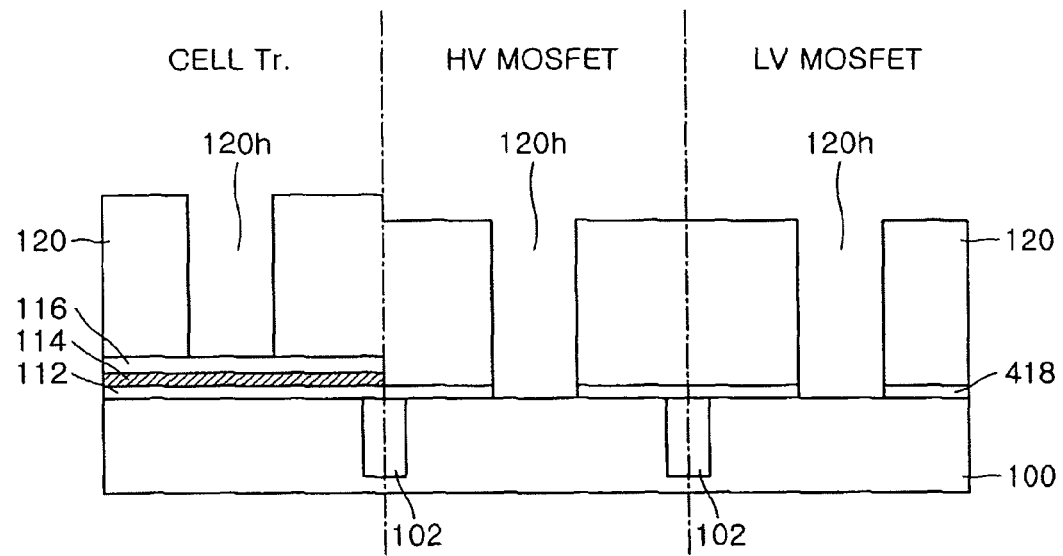
Figure 4C:
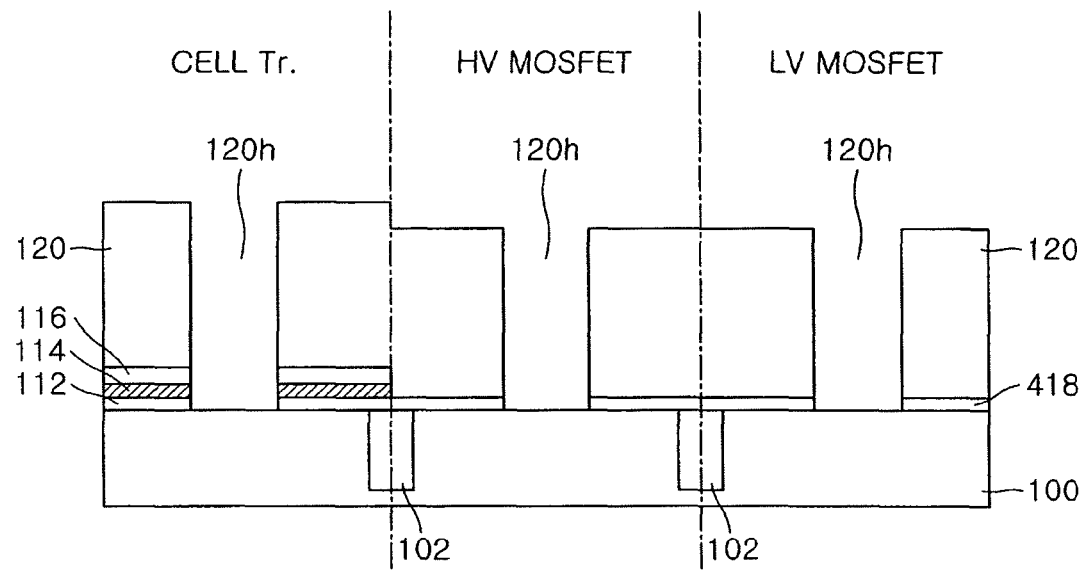
Figure 4D:
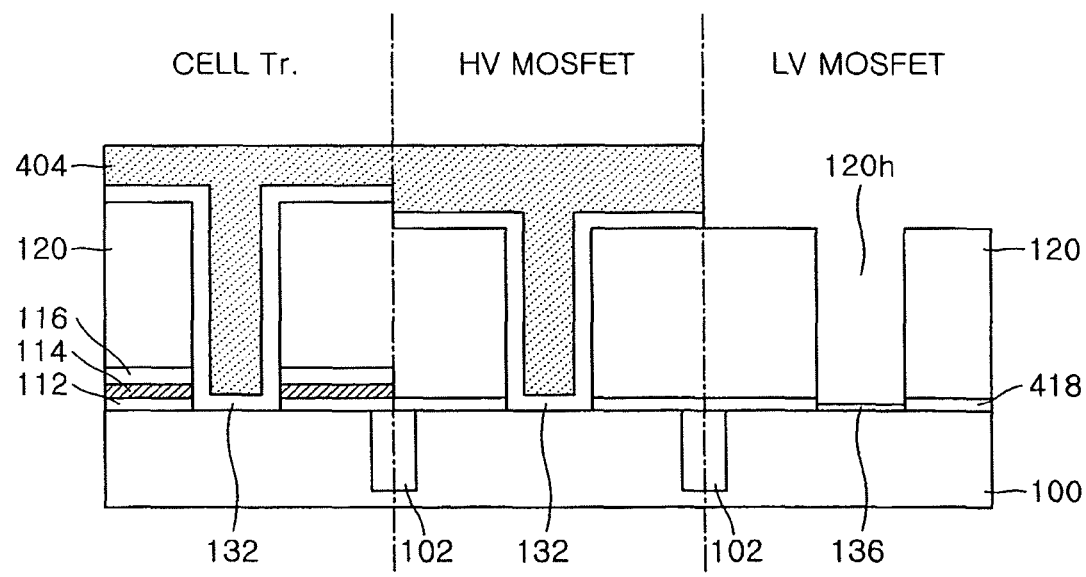
Figure 4E:
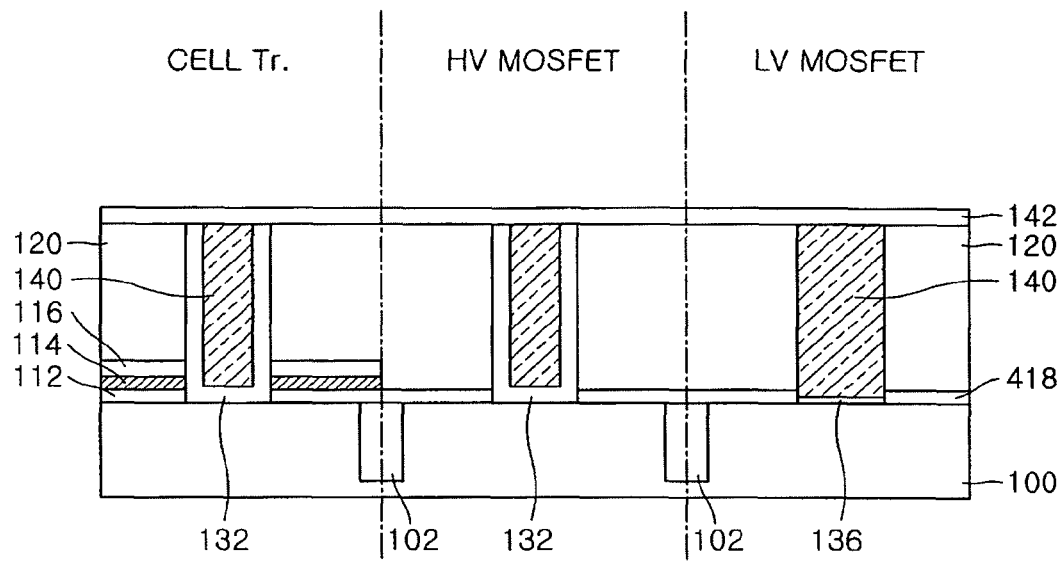
Figure 4F:
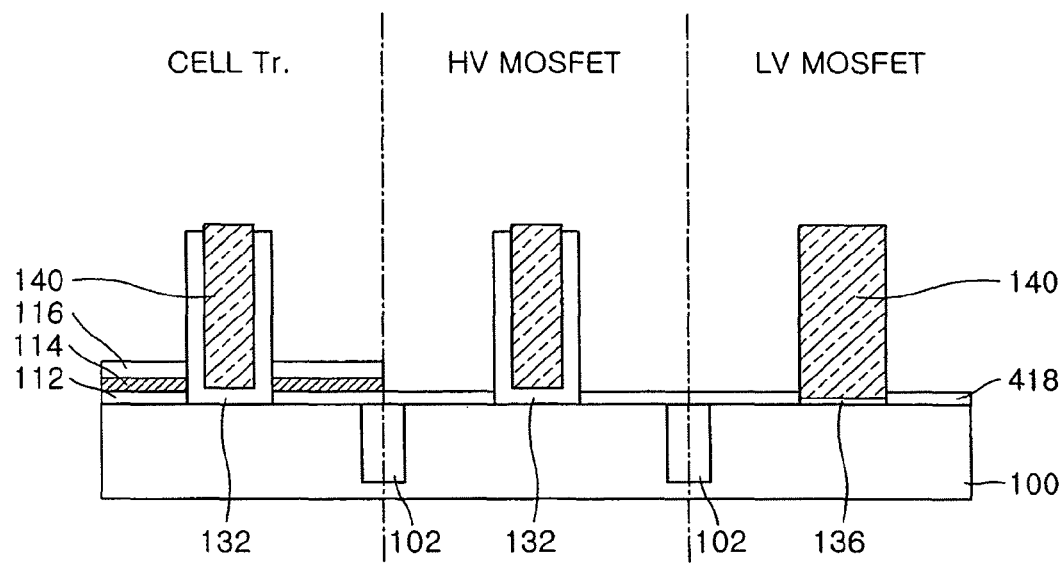
Figure 4G:
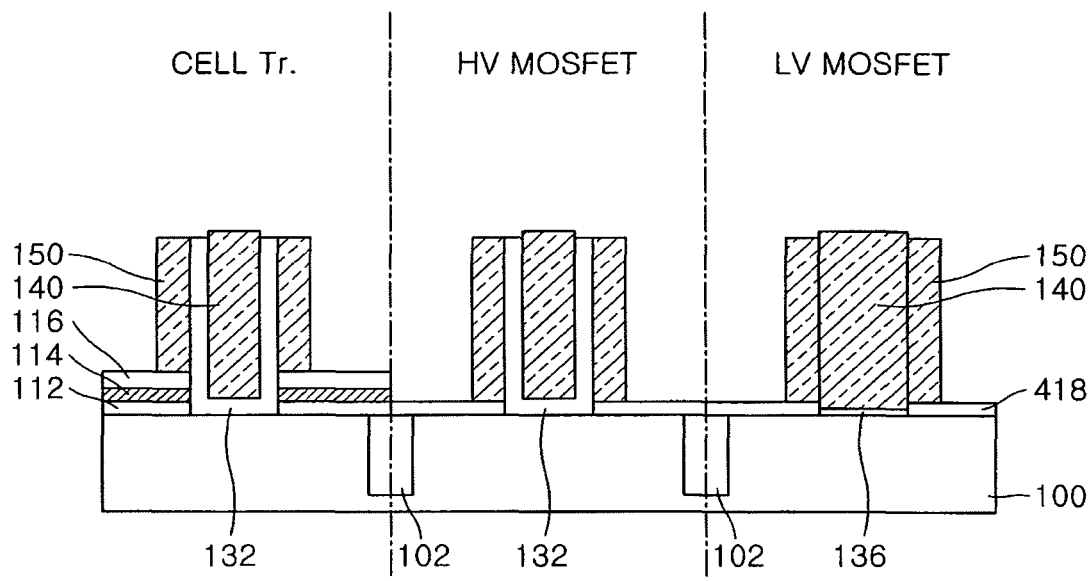
Figure 4H:
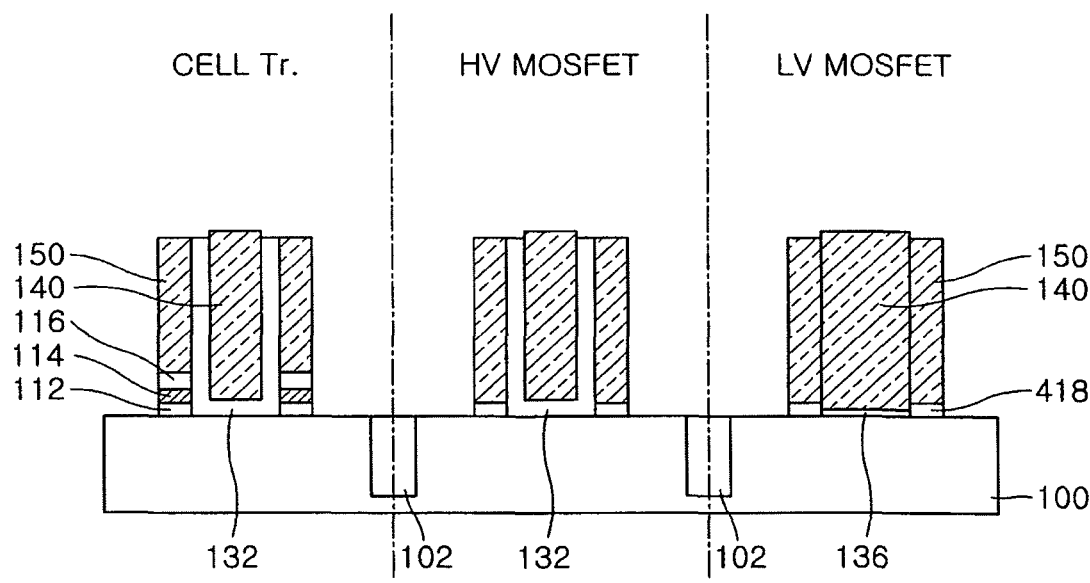
Figure 4I:
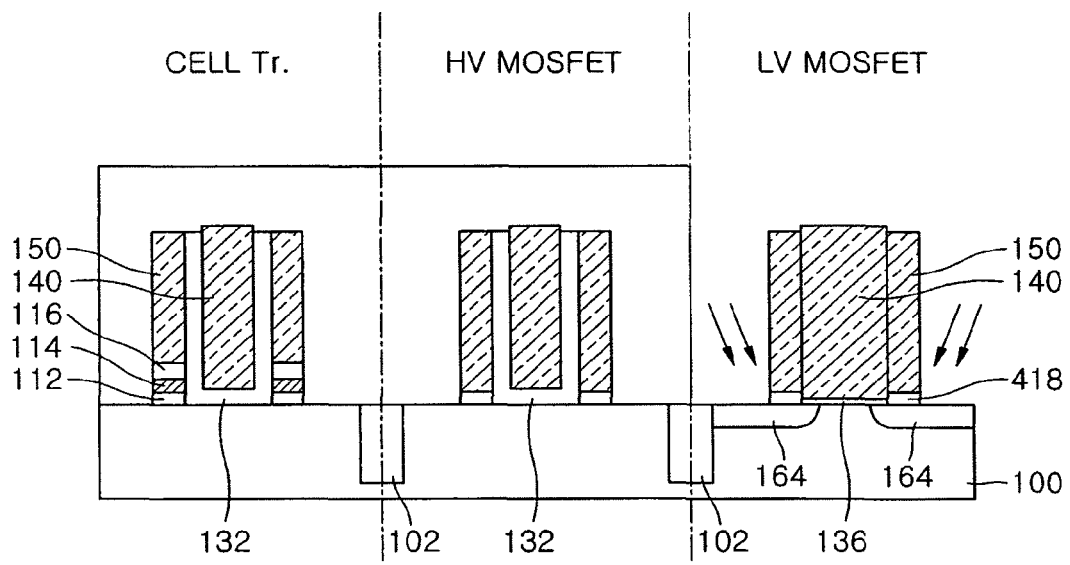
Figure 4J:
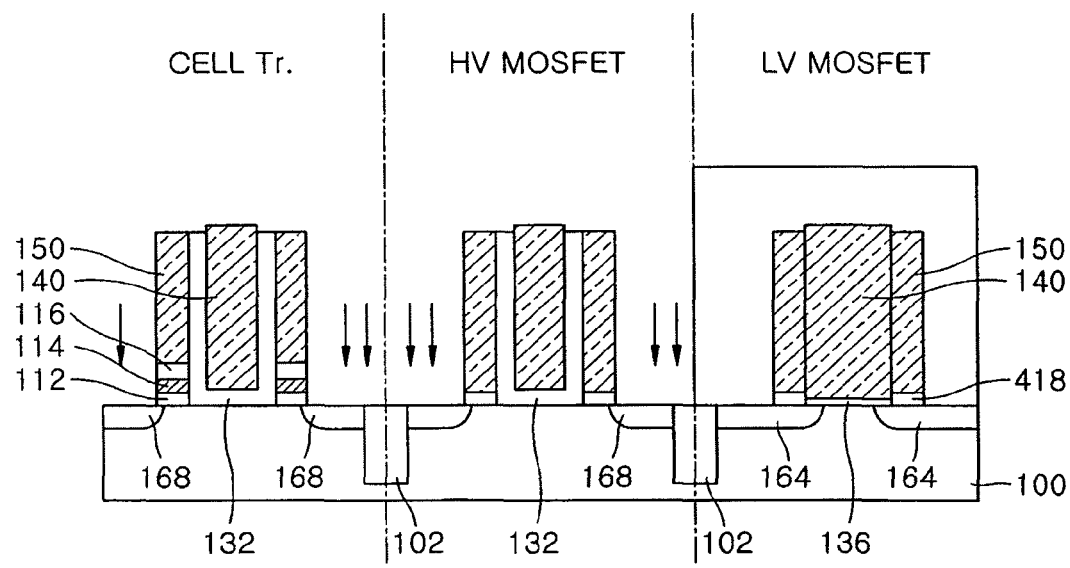
Figure 4K:
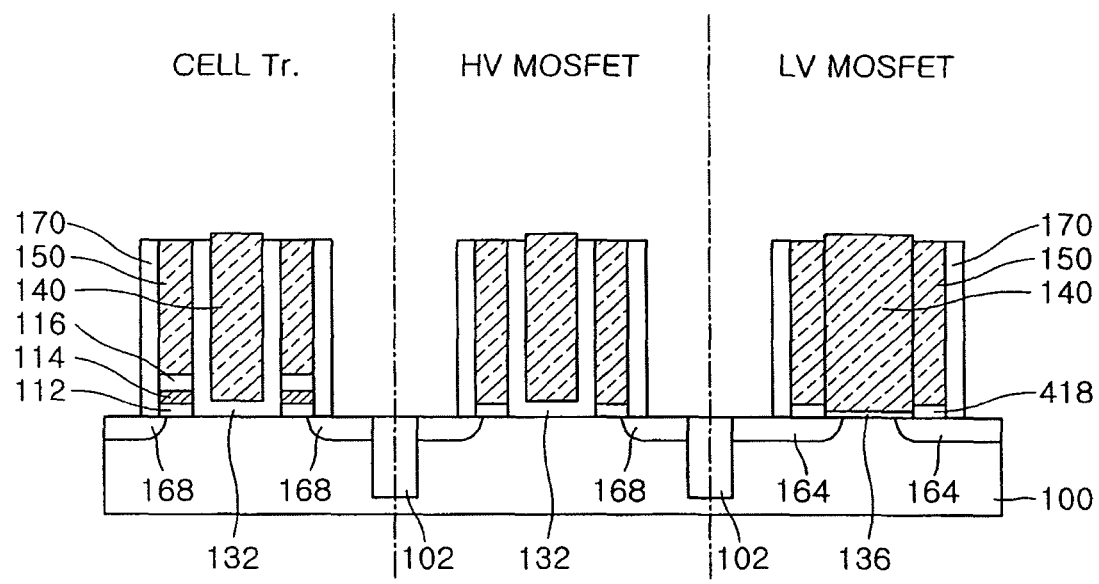
Figure 4L:
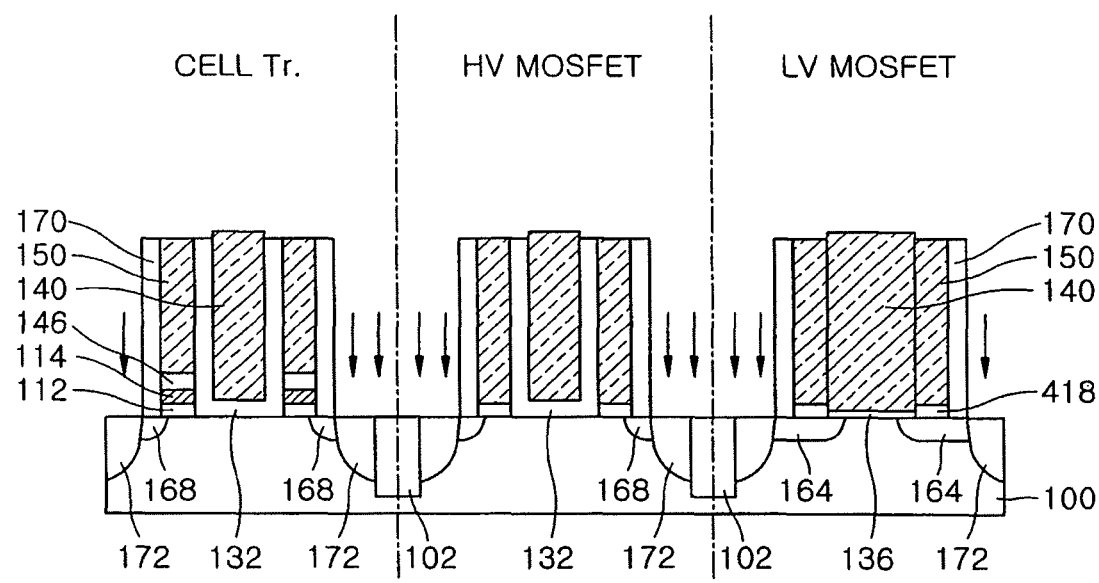
Figure 4M:
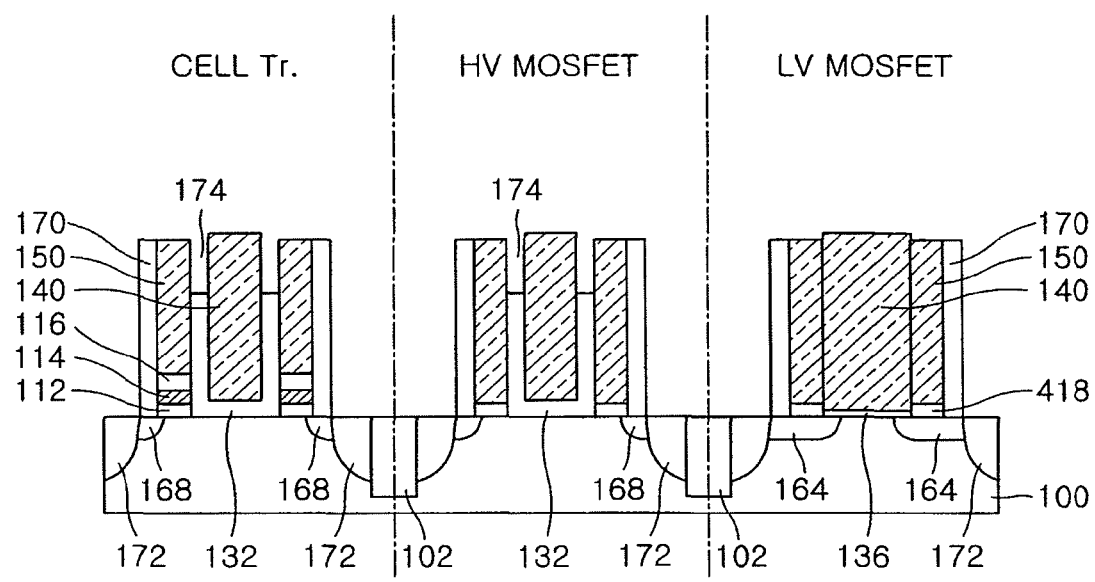
Figure 4N:
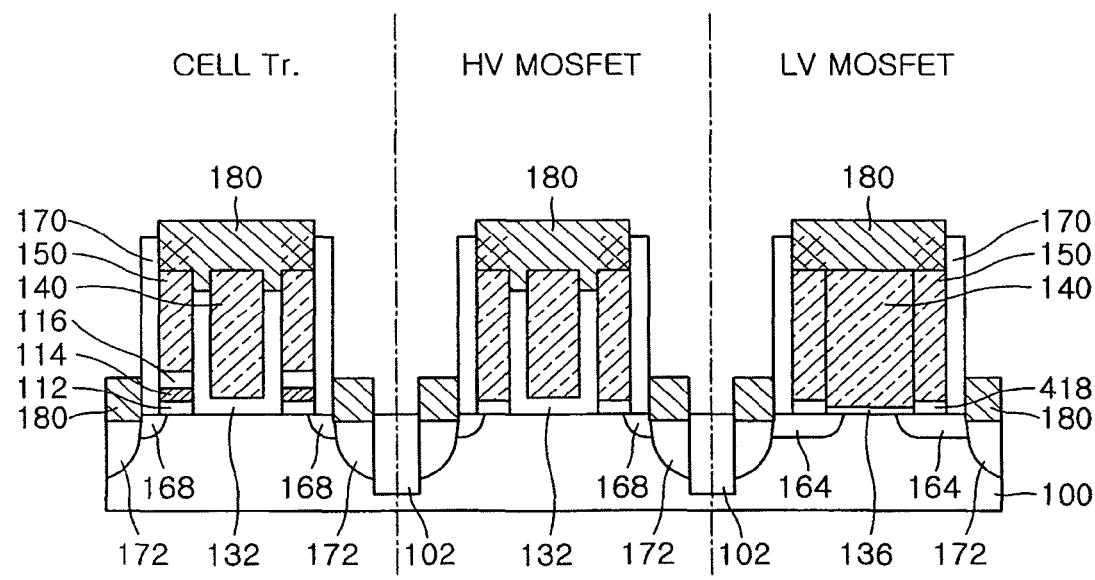

FIGS. 4A through 4N are cross-sectional views illustrating a method of manufacturing a semiconductor device according another embodiment of the present invention. This embodiment is an example of process integration to simultaneously form a cell transistor on a cell array area and a HV transistor and a LV transistor on a peripheral circuit area. In this embodiment, the cell transistor has a notch gate structure, and gate insulation films of the cell transistor, the HV transistor, and the LV transistor have different thicknesses depending on functions of the three transistors. This embodiment includes processes similar to those of the embodiment illustrated in FIGS. 1A through 1OA. The embodiment illustrated in FIGS. 4A through 4N is different from the embodiment illustrated in FIGS. 1A through 1O in that it includes a process of completely removing a memory layer from the transistor formed on the peripheral circuit area as in the embodiments illustrated in FIGS. 2A through 2H and FIGS. 3A through 3K. However, the embodiment illustrated in FIGS. 4A through 4N is different from the embodiments illustrated in FIGS. 2A through 2H and FIGS. 3A through 3K in that the process of completely removing the memory layer from the transistor formed on the peripheral circuit area is performed before the formation of a conductive layer for gate formation. Like reference numerals in the drawings denote like elements, and thus their description will not be repeated.

Referring to FIG. 4A, the lower oxide film 112, the memory layer 114, and the upper oxide film 116 are sequentially stacked on the entire surface of the semiconductor substrate 100 using the same method as described with reference to FIGS. 1A and 1B.

Thereafter, the cell array area of the semiconductor substrate 100 is covered with a first mask pattern 402, for example, a photoresist pattern, and portions of the lower oxide film 112, the memory layer 114, and the upper oxide film 116 stacked on the peripheral circuit area are removed using the first mask pattern 402 as an etch mask. Then, a fourth insulation film 418 is formed on the peripheral circuit area of the semiconductor substrate 100. The fourth insulation film 418 may be an oxide film formed by thermal oxidation.

Referring to FIG. 4B, the first mask pattern 402 is removed, and the dummy pattern 120 is then formed on the upper oxide film 116 and the fourth insulation film 418 using the same method as described with reference to FIG. 1C.

Referring to FIG. 4C, portions of the upper oxide film 116, the memory layer 114, and the lower oxide film 112 exposed through the openings 120h on the cell array area are removed using the dummy pattern 120 as an etch mask, and the fourth insulation film 418 exposed through the openings 120h on the peripheral circuit area is removed using the dummy pattern 120 as an etch mask. Thus, an upper surface of the semiconductor substrate 100 is exposed through the openings 120h.

Referring to FIG. 4D, the first insulation film 132, which is relatively thick, is formed on the exposed upper surface of the semiconductor substrate 100 and the dummy pattern 120 using the same method as described with reference to FIG. 1E. Only the portion of the first insulation film 132 on the area of the peripheral circuit area where the LV MOSFET is to be formed is etched using the second mask pattern 404 as an etch mask. At this time, the first insulation film 132 should be completely removed from the area where the LV MOSFET is to be formed. To achieve this complete removal of the first insulation film 132, when dry etching is used as in FIG. 1E, an etching duration is set longer than that in the case of FIG. 1E. Alternatively, even when wet etching using the second mask pattern 404 as an etch mask is used, the first insulation film 132 can be completely removed from the area where the LV MOSFET is to be formed. Consequently, the openings 120h of the dummy pattern 120 on the LV MOSFET area are completely exposed.

Referring to FIG. 4E, the second mask pattern 404 is removed, and the first conductive layer 140 and the oxide film 142 are formed using the same method as described with reference to FIG. 1F.

Referring to FIG. 4F, the oxide layer 142 and the dummy pattern 120 are sequentially removed using the same method as described with reference to FIG. 1G to expose the upper oxide film 116 and the fourth insulation film 418.

Referring to FIG. 4G, the second conductive layers 150 in the shape of spacers are formed over the sidewalls of the first conductive layer 140 using the same method as described with reference to FIG. 1H. As a result, the second conductive layers 150 on the HV MOSFET area of the peripheral circuit area and the cell array area are formed on portions of the first insulation film 132 that contact sidewalls of the first conductive layer 140. On the other hand, the conductive layer 150 on the LV MOSFET area of the peripheral circuit area is formed directly on the sidewalls of the first conductive layer 140.

Referring to FIG. 4H, exposed portions of the upper oxide film 116, the memory layer 114, and the lower oxide film 112 around the spacers of the second conductive layer 150 on the cell array area are removed to expose the upper surface of the semiconductor substrate 100, and the fourth insulation film 48 exposed around the spacers of the second conductive layer 150 on the peripheral circuit area is removed to expose the upper surface of the semiconductor substrate 100.

Referring to FIG. 4I, the extension areas 164 are formed within the area of the semiconductor substrate 100 on which the LV MOSFET is to be formed, using the same method as described with reference to FIG. 1J.

Referring to FIG. 4J, the extension areas 168 are formed within the cell array area and the area of the peripheral circuit area on which the HV MOSFET is to be formed using the same method as described with reference to FIG. 1K.

Referring to FIG. 4K, the insulation spacers 170 are formed on the sidewalls of the second conductive layer 150, using the same method as described with reference to FIG. 1L.

Referring to FIG. 4L, the source/drain region 172 is simultaneously formed in the cell array area and the peripheral circuit area of the semiconductor substrate 100, using the same method as described with reference to FIG. 1M.

Referring to FIG. 4M, the recesses 174 are formed between the first and second conductive layers 140 and 150, using the same method as described with reference to FIG. 1N.

Referring to FIG. 4N, the metal silicide films 180 are formed on the first and second conductive layers 140 and 150 and the source/drain regions 172 using the same method as described with reference to FIG. 1O.

In the above-described semiconductor device manufacturing method according to the embodiment illustrated in FIGS. 4A through 4N, only a cell transistor and an HV MOSFET employ a structure in which an electrode comprised of the second conductive layer 150 in the shape of spacers is used to form a gate. A LV MOSFET employs a structure in which the electrode in the shape of spacer is not used. Also, the memory layer 114, which is a storage node only the cell array area needs, is removed from an area other than the cell array area before a gate structure is formed. That is, a two-bit NVM transistor is formed on the cell array area, and the memory layers 114 under the second conductive layers 150 of the HV MOSFET and the LV MOSFET on the peripheral circuit area are removed, so that degradation of the electrical performance of a peripheral circuit is prevented.

Although a bulk semiconductor substrate is used in the above-described embodiments of the present invention, it will be understood to one of ordinary skill in the art that process integration according to the present invention may be achieved using all other semiconductor substrates including a silicon on insulator (SOI).

In a semiconductor device manufacturing method according to the present invention, a cell transistor formed on a cell array area employs a structure in which an electrode in the shape of spacers is used to form a gate and a multi-bit operation is possible even using localized bits. Transistors having structures optimized to satisfy different requirements depending upon functions of the transistors can be formed on a peripheral circuit area. The transistor for the cell array area and the transistors for the peripheral circuit area differently designed according to unique functions of the transistors are simultaneously manufactured using an easy process. Thus, a process of forming a cell transistor capable of performing a multi-bit operation using localized bits can be efficiently integrated.

In the semiconductor device manufacturing method according to the present invention, a process of integrating a memory cell of a non-volatile memory device into a peripheral circuit can be simplified, and the transistors for the peripheral circuit area manufactured simultaneously with the cell transistor may have a notch gate structure to thus reduce leakage current in a gate. Additionally, an overlap capacitance between a source/drain and the gate can be reduced, and the performance of the memory device can improve.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
    a semiconductor substrate including a cell array area and a peripheral circuit area;
    a cell transistor on the cell array area of the semiconductor substrate, the cell transistor including a first notch gate structure, a first channel region formed on the semiconductor substrate under the first notch gate structure, a first source region and a first drain region formed on both sides of the first channel region, a first gate insulation film formed between the first channel region and the first notch gate structure, and two first memory layers locally formed on areas adjacent to the first source region and the first drain region between the first channel region and the first notch gate structure, wherein the first notch gate structure has a first conductive layer formed on the first gate insulation film and second conductive layers in the shape of spacers formed on portions of a first insulation film that contact both sidewalls of the first conductive layer; and
    a plurality of peripheral circuit transistors on the peripheral circuit area of the semiconductor substrate, at least one peripheral circuit transistor of the plurality of peripheral circuit transistors including a second notch gate structure, a second channel region formed on the semiconductor substrate under the second notch gate structure, a second source region and a second drain region formed on both sides of the second channel region, and a second gate insulation film formed between the second channel region and the second notch gate structure, wherein the second notch gate structure has a third conductive layer formed on the second gate insulation film and fourth conductive layers in the shape of spacers formed on sidewalls of the third conductive layer.

2. The semiconductor device of claim 1, wherein the two first memory layers are formed under the second conductive layers, respectively, and are spaced apart with each other with the first conductive layer therebetween.

3. The semiconductor device of claim 1, wherein the plurality of peripheral circuit transistors include a high voltage transistor and a low voltage transistor.

4. The semiconductor device of claim 1, wherein the fourth conductive layers of the second notch gate structure are formed on portions of a second insulation film that contact both sidewalls of the third conductive layer.

5. The semiconductor device of claim 1, wherein the fourth conductive layers of the second notch gate structure directly contact sidewalls of the third conductive layer, respectively.

6. The semiconductor device of claim 1, wherein the plurality of peripheral circuit transistors comprise a first peripheral circuit transistor including the second notch gate structure, and a second peripheral circuit transistor including the second notch gate structure and having a different structure from the first peripheral circuit transistor.

7. The semiconductor device of claim 6, wherein the thickness of the second gate insulation film of the first peripheral circuit transistor is different from that of the second gate insulation film of the second peripheral circuit transistor.

8. The semiconductor device of claim 6, wherein the first peripheral circuit transistor further comprises a second insulation film interposed between the fourth conductive layers and both sidewalls of the third conductive layer, and the fourth conductive layers of the second peripheral circuit transistor directly contact sidewalls of the third conductive layer of the second peripheral circuit transistor, respectively.

9. The semiconductor device of claim 8, wherein the first peripheral circuit transistor is a high voltage transistor and the second peripheral circuit transistor is a low voltage transistor.

10. The semiconductor device of claim 9, wherein the second peripheral circuit transistor has a gate insulation film of a thickness smaller than a thickness of a gate insulation film of the first peripheral circuit transistor.

11. The semiconductor device of claim 6, wherein the fourth conductive layers of the first peripheral circuit transistor directly contact sidewalls of the third conductive layer of the first peripheral circuit transistor, respectively, and the fourth conductive layers of the second peripheral circuit transistor directly contact sidewalls of the third conductive layer of the second peripheral circuit transistor, respectively.

12. The semiconductor device of claim 11, wherein the first peripheral circuit transistor is a high voltage transistor and the second peripheral circuit transistor is a low voltage transistor, and the second peripheral circuit transistor has a gate insulation film of a thickness smaller than a thickness of a gate insulation film of the first peripheral circuit transistor.

13. The semiconductor device of claim 1, wherein the at least one peripheral circuit transistor further comprises two second memory layers locally formed on areas adjacent to the second source region and the second drain region between the second channel region and the second notch gate structure, the two second memory layers formed under the fourth conductive layers, respectively, and spaced apart with each other with the third conductive layer therebetween.

14. The semiconductor device of claim 1, wherein the plurality of peripheral circuit transistors include a high voltage transistor and a low voltage transistor, wherein the high voltage transistor has the same structure as the cell transistor, and the low voltage transistor has a gate insulation film of a thickness smaller than a thickness of the first gate insulation film of the cell transistor.

15. The semiconductor device of claim 1, wherein the plurality of peripheral circuit transistors include a high voltage transistor and a low voltage transistor, wherein the high voltage transistor has the same structure as the cell transistor, and the low voltage transistor has a channel region of a length smaller than a length of the first channel region of the cell transistor.

16. The semiconductor device of claim 1, wherein a first distance between the semiconductor substrate and the first conductive layer is less than a second distance between the semiconductor substrate and the second conductive layers in the cell array area.

17. The semiconductor device of claim 16, wherein a third distance between the semiconductor substrate and the third conductive layer is less than a fourth distance between the semiconductor substrate and the fourth conductive layers in the peripheral circuit area.

18. The semiconductor device of claim 17, wherein the fourth distance is the same as the second distance.

19. The semiconductor device of claim 17, wherein the fourth distance is different from the second distance.

20. The semiconductor device of claim 1, wherein the first notch gate structure further comprising a first metal silicide film electrically connected to the first conductive layer and the second conductive layers, and the second notch gate structure further comprising a second metal silicide film electrically connected to the third conductive layer and the fourth conductive layers.

* * * * *